United States Patent
Kakimoto et al.

(10) Patent No.: US 10,818,843 B2
(45) Date of Patent: Oct. 27, 2020

(54) POLYMER COMPOUND AND LIGHT EMITTING DEVICE USING THE SAME

(71) Applicant: Sumitomo Chemical Company, Limited, Tokyo (JP)

(72) Inventors: Hidenobu Kakimoto, Osaka (JP); Nozomi Masui, Tsukuba (JP); Tomoya Nakatani, Tsukuba (JP); Noriyuki Hida, Osaka (JP); Yasutaka Yatsumonji, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 101 days.

(21) Appl. No.: 14/915,313

(22) PCT Filed: Aug. 29, 2014

(86) PCT No.: PCT/JP2014/073413
§ 371 (c)(1),
(2) Date: Feb. 29, 2016

(87) PCT Pub. No.: WO2015/037521
PCT Pub. Date: Mar. 19, 2015

(65) Prior Publication Data
US 2016/0211452 A1 Jul. 21, 2016

(30) Foreign Application Priority Data

Sep. 11, 2013 (JP) .................. 2013-188009

(51) Int. Cl.
*H01L 51/00* (2006.01)
*C09K 11/06* (2006.01)
(Continued)

(52) U.S. Cl.
CPC .......... *H01L 51/0039* (2013.01); *C08G 61/12* (2013.01); *C08G 61/122* (2013.01);
(Continued)

(58) Field of Classification Search
CPC ............. H01L 51/0039; H01L 51/0032; H01L 51/34–39; H01L 51/43
See application file for complete search history.

(56) References Cited

U.S. PATENT DOCUMENTS 6,166,172 A 12/2000 McCullough et al.
2003/0143429 A1* 7/2003 Suzuki .................. C08G 61/02
428/690
(Continued)

FOREIGN PATENT DOCUMENTS

| CN | 101326214 A | 12/2008 |
| CN | 101663345 A | 3/2010 |

(Continued)

OTHER PUBLICATIONS

English machine translation provided by the EPO. (Year: 2017).*
STIC search conducted via Julia Wang. (Year: 2018).*
English machine translation of WO-2012086667-A1 provided by the EPO. 2019. (Year: 2019).*
STIC search results in regards to the diclorobis(dicyclopentyl(o-methoxyphenyl)phosphinepalladium catalyst. (Year: 2020).*
Office Action dated Nov. 13, 2017 in TW Application No. 103130728.
Office Action dated Jun. 24, 2015 in JP Application No. 2015-503393.

(Continued)

*Primary Examiner* — Daniel P Malley, Jr.
(74) *Attorney, Agent, or Firm* — Panitch Schwarze Belisario & Nadel LLP

(57) ABSTRACT

A polymer compound comprising a constitutional unit represented by the following formula (1) and a constitutional unit represented by the following formula (X) and/or a constitutional unit represented by the following formula (Y), wherein the content of the hydroxyl groups contained in the polymer compound is less than 0.02 mol %:

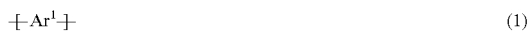

[wherein, $Ar^1$ represents an arylene group and this group optionally has a substituent.]

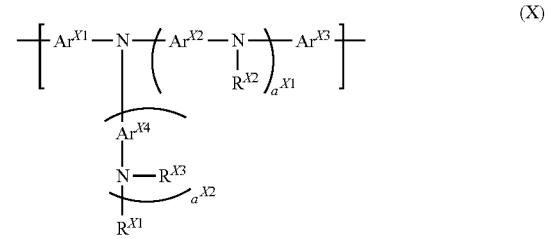

[wherein, $a^{X1}$ and $a^{X2}$ each independently represent an integer of 0 or more. $Ar^{X1}$ and $Ar^{X3}$ each independently represent an arylene group or a divalent heterocyclic group and these groups each optionally have a substituent. $Ar^{X2}$ and $Ar^{X4}$ each independently represent an arylene group, a divalent heterocyclic group or a divalent group in which at least one arylene group and at least one divalent heterocyclic group are bonded directly to each other, and these groups each optionally have a substituent. When there are a plurality of $Ar^{X2}$ and a plurality of $Ar^{X4}$, each of them may be the same or different. $R^{X1}$, $R^{X2}$ and $R^{X3}$ each independently represent an alkyl group, an aryl group or a monovalent heterocyclic group and these groups each optionally have a substituent. When there are a plurality of $R^{X2}$ and a plurality of $R^{X3}$, each of them may be the same or different.]

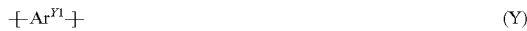

[wherein, $Ar^{Y1}$ represents an arylene group, a divalent heterocyclic group or a divalent group in which at least one arylene group and at least one divalent heterocyclic group are bonded directly to each other, and these groups each optionally have a substituent.].

5 Claims, 1 Drawing Sheet

(51) Int. Cl.
*C08G 61/12* (2006.01)
*H01L 51/50* (2006.01)

(52) U.S. Cl.
CPC .......... C09K 11/06 (2013.01); H01L 51/0003 (2013.01); H01L 51/0035 (2013.01); H01L 51/0043 (2013.01); *C08G 2261/12* (2013.01); *C08G 2261/148* (2013.01); *C08G 2261/1412* (2013.01); *C08G 2261/3142* (2013.01); *C08G 2261/3162* (2013.01); *C08G 2261/3221* (2013.01); *C08G 2261/411* (2013.01); *C08G 2261/512* (2013.01); *C08G 2261/52* (2013.01); *C08G 2261/95* (2013.01); *C09K 2211/1416* (2013.01); *C09K 2211/1433* (2013.01); *C09K 2211/1466* (2013.01); *C09K 2211/1475* (2013.01); *C09K 2211/1483* (2013.01); *C09K 2211/185* (2013.01); *H01L 51/006* (2013.01); *H01L 51/0052* (2013.01); *H01L 51/0067* (2013.01); *H01L 51/5012* (2013.01); *H01L 51/5016* (2013.01); *H01L 51/5056* (2013.01)

(56) References Cited

U.S. PATENT DOCUMENTS

| | | | |
|---|---|---|---|
| 2006/0058524 | A1 | 3/2006 | Falcou et al. |
| 2007/0048637 | A1 | 3/2007 | Okada et al. |
| 2010/0109517 | A1 | 5/2010 | Fukushima et al. |
| 2011/0187266 | A1 | 8/2011 | Fukushima et al. |
| 2011/0284826 | A1 | 11/2011 | Hayoz et al. |
| 2012/0037889 | A1 | 2/2012 | Tanaka et al. |
| 2012/0142872 | A1 | 6/2012 | Lamatsch et al. |
| 2012/0326140 | A1* | 12/2012 | Fukushima ............ C07C 25/22 257/40 |
| 2013/0270486 | A1* | 10/2013 | Yoshida ............. H01L 51/0039 252/500 |
| 2014/0231717 | A1 | 8/2014 | Sakakibara et al. |

FOREIGN PATENT DOCUMENTS

| | | | | |
|---|---|---|---|---|
| EP | 2573125 | A1 | 3/2013 | |
| EP | 2581399 | A1 | 4/2013 | |
| GB | 2452359 | A | 3/2009 | |
| JP | 2000230040 | A | 8/2000 | |
| JP | 2001520289 | A | 10/2001 | |
| JP | 2002536492 | A | 10/2002 | |
| JP | 2007092032 | A | 4/2007 | |
| JP | 2011174061 | A | 9/2011 | |
| JP | 2011174062 | A | 9/2011 | |
| JP | 2012036388 | A * | 2/2012 | .......... C07C 51/377 |
| JP | 2012036388 | A | 2/2012 | |
| JP | 2012209452 | A | 10/2012 | |
| JP | 2012212704 | A | 11/2012 | |
| TW | 201211203 | A | 3/2012 | |
| WO | 9920675 | A1 | 4/1999 | |
| WO | 0046321 | A1 | 8/2000 | |
| WO | 2011/093428 | A1 | 8/2011 | |
| WO | WO-2012086667 | A1 * | 6/2012 | ........ H01L 51/0039 |
| WO | 2013058160 | A1 | 4/2013 | |

OTHER PUBLICATIONS

Office Action dated Dec. 24, 2015 in JP Application No. 2015-503393.
Office Action dated Nov. 28, 2016 in CN Application No. 201480049646.7.
Extended Search Report dated Apr. 5, 2017 in EP Application No. 148432362.
Kappaun et al, "Preparation of Poly(fluorene)s Using Trans-Bis(dicyclohexylamine)Palladium Diacetate as a Catalyst: Scope and Limitations," Journal of Polymer Science, vol. 44, pp. 2130-2138 (2006).
Lu et al, "Synthesis, Photophysics and Electroluminescent Properties of a Novel Phenylene-Ethynylene and Bezothiadiazole Alternating Copolymer," Synthetic Metals, vol. 146, pp. 175-180 (2004).
International Search Report and Written Opinion (English language) dated Nov. 18, 2014 in International Application No. PCT/JP2014/073413.
Office Action dated Aug. 22, 2017 in CN Application No. 201480049646.7.
Office Action dated Apr. 2, 2020 in EP Application No. 14843263.2.

\* cited by examiner

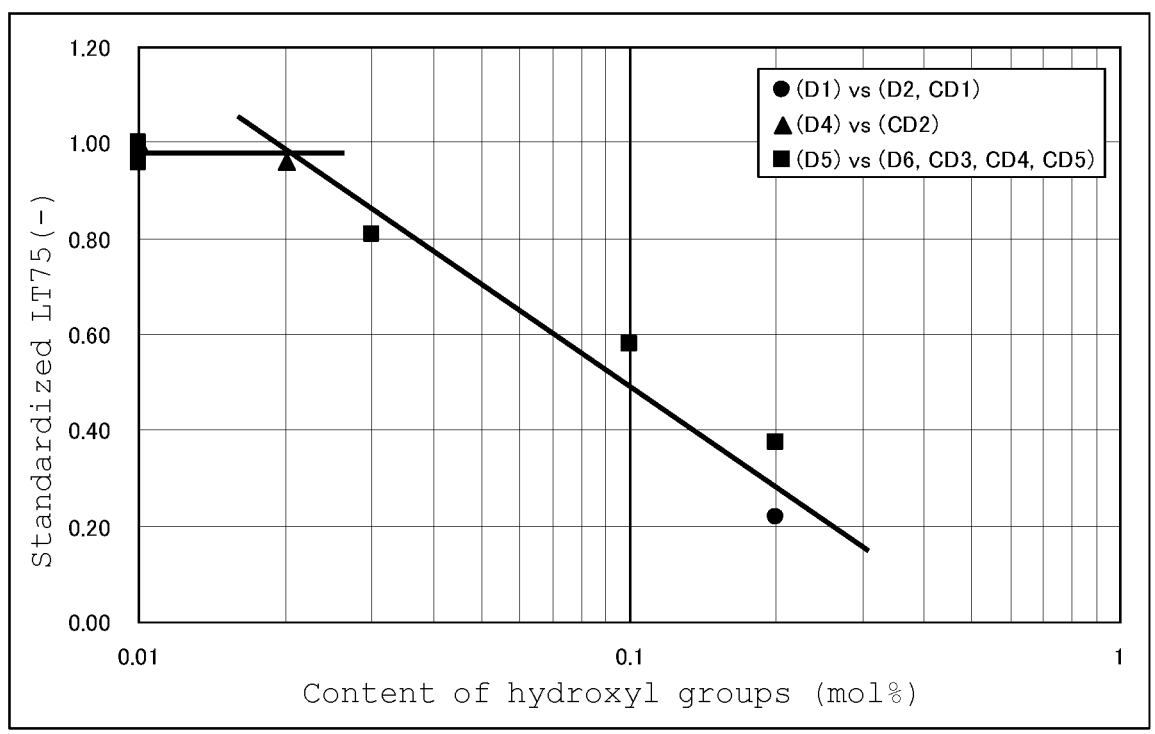

POLYMER COMPOUND AND LIGHT EMITTING DEVICE USING THE SAME

CROSS-REFERENCE TO RELATED APPLICATION

This application is a Section 371 of International Application No. PCT/JP2014/073413, filed Aug. 29, 2014, which was published in the Japanese language on Mar. 19, 2015, under International Publication No. WO 2015/037521 A1, and the disclosure of which is incorporated herein by reference.

TECHNICAL FIELD

The present invention relates to a polymer compound and a light emitting device using the same.

BACKGROUND ART

Light emitting devices such as an organic electroluminescent, device can be used suitably for application of displays because of high light emission efficiency and low driving voltage, and are recently receiving attention. This light emitting device comprises organic layers such as a light emitting layer and a charge transporting layer. There is a study on a polymer compound used for production of a light emitting device because an organic layer can be formed by coating methods typified by an inkjet printing method by use of a polymer compound.

As the polymer compound used for production of a light emitting device, for example, a polymer compound comprising a constitutional unit derived from fluorene and a constitutional unit derived from an arylamine is known, and the polymer compound is produced by condensation polymerization of an organic boron compound and an organic halogen compound as raw material monomers in the presence of a palladium catalyst and a base (Patent documents 1 and 2).

PRIOR ART DOCUMENT

Patent Document

Patent document 1: Japanese Patent Application National Publication No. 2001-520289
Patent document 2: Japanese Patent Application National Publication No. 2002-536492

SUMMARY OF THE INVENTION

Problem to be Solved by the Invention

Light emitting devices produced by using polymer compounds described in the above-described Patent documents 1 and 2, however, had not necessarily sufficient luminance life.

Then, the present invention has an object of providing a polymer compound which is useful for production of a polymer compound excellent in luminance life.

Means for Solving the Problem

The present inventors have found that the content of the hydroxyl groups contained in a polymer compound exerts an influence on the luminance life of a light emitting device and found a production method capable of seducing the content of the hydroxyl groups contained in a polymer compound, leading to completion of the present invention.

In a first aspect, the present invention provides a polymer compound comprising
a constitutional unit represented by the following formula (1) and
a constitutional unit represented by the following formula (X) and/or a constitutional unit represented by the following formula (Y) (differing from the constitutional unit represented by the formula (1)) (that is, a constitutional unit represented by the following formula (X), a constitutional unit represented by the following formula (Y) (differing from the constitutional unit represented by the formula (1)), or, both a constitutional unit represented by the following formula (X) and a constitutional unit represented by the following formula (Y)),
wherein the content of the hydroxyl groups contained in the polymer compound is less than 0.02 mol %:

(1)

[wherein, $Ar^1$ represents an arylene group and this group optionally has a substituent.]

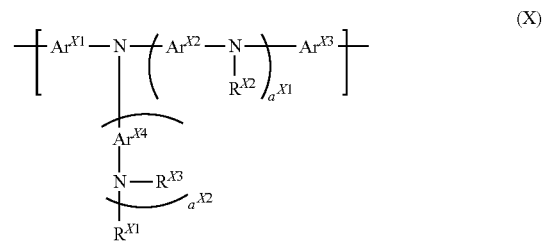

(X)

[wherein,
$a^{X1}$ and $a^{X2}$ each independently represent an integer of 0 or more.
$Ar^{X1}$ and $Ar^{X3}$ each independently represent an arylene group or a divalent heterocyclic group and these groups each optionally have a substituent.
$Ar^{X2}$ and $Ar^{X4}$ each independently represent an arylene group, a divalent heterocyclic group or a divalent group in which at least one arylene group and at least one divalent heterocyclic group are bonded directly to each other, and these groups each optionally have a substituent. When there are a plurality of $Ar^{X2}$ and a plurality $Ar^{X4}$, each of them may be the same or different.
$R^{X1}$, $R^{X2}$ and $R^{X3}$ each independently represent an alkyl group, an aryl group or a monovalent heterocyclic group and these groups each optionally have a substituent. When there are a plurality of $R^{X2}$ and a plurality of $R^{X3}$, each of them may be the same or different.]

(Y)

[wherein, $Ar^{Y1}$ represents an arylene group, a divalent heterocyclic group or a divalent group in which at least one arylene group and at least one divalent heterocyclic group are bonded directly to each other, and these groups each optionally have a substituent.]

In a second aspect, the present invention provides a method for producing the above-described polymer compound, the method comprising
a step of condensation-polymer zing
a compound represented by the following formula) and
a compound represented by the following formula (M-X) and/or a compound represented by the following formula (M-Y) (differing from the compound, represented by the formula (M-1) (that is, a compound represented by the following formula (M-X), a compound represented by the following formula (M-Y) (differing from the compound represented by the formula (M-1)), or both a compound represented by the following formula (M-X) and a compound represented by the following formula (M-Y) under the condition of an oxygen concentration of less than 0.5%:

$$Z^{C1}-Ar^1-Z^{C2} \quad (M-1)$$

$$Z^{C3}-Ar^{X1}-N\left(Ar^{X2}-N\right)_{a^{X1}}Ar^{X3}-Z^{C4} \quad (M-X)$$
$$\begin{array}{c} | \\ Ar^{X4} \\ | \\ N-R^{X3} \\ \overbrace{\phantom{XXX}}_{a^{X2}} \\ R^{X1} \end{array}$$

$$Z^{C5}-Ar^{Y1}-Z^{C6} \quad (M-Y)$$

[wherein,
$Ar^1$, $a^{X1}$, $a^{X2}$, $Ar^{X1}$, $Ar^{X3}$, $Ar^{X2}$, $Ar^{X4}$, $R^{X1}$, $R^{X2}$, $R^{X3}$ and $Ar^{Y1}$ represent the same meaning as described above.

$Z^{C1}$, $Z^{C2}$, $Z^{C3}$, $Z^{C4}$, $Z^{C5}$, and $Z^{C6}$ each independently represent a group selected from the group consisting of Group A of substituents and Group B of substituents.]

<Group A of Substituents> a chlorine atom, a bromine atom, an iodine atom and a group represented by —O—S(=O)$_2$R$^{C1}$, wherein R$^{C1}$ represents an alkyl group or an aryl group, and these groups each optionally have a substituent.

<Group B of Substituents> a group represented by —B(OR$^{C2}$)$_2$, wherein R$^{C2}$ represents a hydrogen atom, an alkyl group or an aryl group and these groups each optionally have a substituent. The R$^{C2}$s may be the same or different and may be combined together to form a ring together with the oxygen atoms to which they are attached, a group represented by —BF$_3$Q', wherein Q' represents Li, Na, K, Rb or Cs, a group represented by —MgY', wherein Y' represents a chlorine atom, a bromine atom or an iodine atom, a group represented by —ZnY", wherein Y" represents a chlorine atom, a bromine atom or an iodine atom, and a group represented by —Sn(R$^{C3}$)$_3$, wherein R$^{C3}$ represents a hydrogen atom, an alkyl group or an aryl group and these groups each optionally have a substituent. The R$^{C3}$s may be the same or different and may be combined together to form a ring together with the tin atom to which they are attached.

In a third aspect, the present invention provides a method for producing the above-described polymer compound, the method comprising a step of condensation-polymerizing a compound represented by the above-described formula (M-1) and a compound represented by the above-described formula (M-X) and/or a compound represented by the above-described formula (M-Y) (differing from the compound represented by the above-described formula (M-1)) (that is, a compound represented by the following formula (M-X), a compound represented by the following formula (M-Y) (differing from the compound represented b; the formula (M-1)), or both a compound represented by the following formula (M-X) and a compound represented by the following formula (M-Y)), and a subsequent step of reacting the condensation polymer with a compound represented by the following formula (2):

$$R^{21}-X^{21} \quad (2)$$

[wherein,

R$^{21}$ represents a group represented by —C(R$^{22}$)$_3$, a group represented by —Si(R$^{22}$)$_3$ or a group represented by —Ge(R$^{22}$)$_3$, wherein R$^{22}$ represents a hydrogen atom, an alkyl group, an aryl group or a monovalent heterocyclic group and these groups each optionally have a substituent. The R$^{22}$s may be the same or different and may form a ring together with the atom to which they are attached.

X$^{21}$ represents a chlorine atom, a bromine atom or an iodine atom.].

In a fourth aspect, the present invention provides a composition comprising the above-described polymer compound and at least one material selected from the group consisting of a hole transporting material, a hole injection material, an electron transporting material, an electron injection material, a light emitting material, an antioxidant and a solvent.

In a fifth aspect, the present invention provides a light emitting device comprising an anode, a cathode and a light emitting layer disposed between the anode and the cathode, wherein the light emitting layer is a layer obtained by using the above-described polymer compound.

Effect of the Invention

The present invention can provide a polymer compound which is useful for production of a light emitting device excellent in luminance life.

BRIEF EXPLANATION OF DRAWING

FIG. 1 is a view showing the relation between the content of the hydroxyl groups contained in a polymer compound and standardized LT75 (that is, the time until the luminance becomes 75% of the initial luminance), showing a light emitting device D1 versus a light emitting device D2 and a light emitting device CD1 (LT75 of a light emitting device D1 is standardized to 1.00), a light emitting device D4 versus a light emitting device CD2 (LT75 of a light emitting device D4 is standardized to 1.00), and a light emitting device D5 versus a light emitting device D6, a light emitting device CD3, a light emitting device CD4 and a light emitting device CD5 (LT75 of a light emitting device D5 is standardized to 1.00). For a polymer compound in which the content of the hydroxyl groups is less than 0.01 mol %, the content of the hydroxyl groups is described as 0.01 mol %.

MODES FOR CARRYING OUT THE INVENTION

<Explanation of Common Term>

Terms commonly used in the present specification described below have the following meanings unless otherwise stated.

Me represents a methyl group, Et represents an ethyl group, i-Pr represents an isopropyl group, n-Bu represents a n-butyl group, and t-Bu represents a tert-butyl group.

In the present specification, the hydrogen atom may be a light hydrogen atom or a heavy hydrogen atom.

"Polymer compound" denotes a polymer having molecular weight distribution and having a polystyrene-equivalent number average molecular weight of $1\times10^3$ to $1\times10^8$. The total amount of constitutional units contained in the polymer compound is 100 mol %.

"Low molecular weight compound" denotes a compound having no molecular weight distribution and having a molecular weight of $1\times10^4$ or less.

"Constitutional unit" denotes a unit structure found once or more in a polymer compound.

"Alkyl group" may be any of linear, branched or cyclic. The number of carbon atoms of the linear alkyl group is, not including the number of carbon atoms of a substituent, usually 1 to 50, preferably 3 to 30, more preferably 4 to 20. The number of carbon atoms of the branched or cyclic alkyl groups is, not including the number of carbon atoms of a substituent, usually 3 to 50, preferably 3 to 30, more preferably 4 to 20.

The alkyl group optionally has a substituent, and examples thereof include a non-substituted alkyl group such as a methyl group, an ethyl group, a n-propyl group, an isopropyl group, a n-butyl group, an isobutyl group, a tert-butyl group, a n-pentyl group, an isoamyl group, 2-ethylbutyl group, a n-hexyl group, a cyclohexyl group, a n-heptyl group, a cyclohexylmethyl group, a cyclohexylethyl group, a n-octyl group, a 2-ethylhexyl group, a 3-n-propylheptyl group, a n-decyl group, a 3,7-dimethyloctyl group, a 2-ethyloctyl group, a 2-n-hexyldecyl group and a n-dodecyl group; and a substituted alkyl group such as a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-n-hexylphenyl) propyl group and a 6-ethyloxyhexyl group.

"Aryl group" denotes an atomic group remaining after removing from an aromatic hydrocarbon one hydrogen atom linked directly to a carbon atom constituting the ring. The number of carbon atoms of the aryl group is, not including the number of carbon atoms of a substituent, usually 6 to 60, preferably 6 to 20, more preferably 6 to 10.

The aryl group optionally has a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, a 4-phenylphenyl group, and groups obtained by substituting a hydrogen atom in these groups with an alkyl group, an alkoxy group, an aryl group, a fluorine atom or the like.

"Alkoxy group" may be any of linear, branched or cyclic. The number of carbon atoms of the linear alkoxy group is, not including the number of carbon atoms of a substituent, usually 1 to 40, preferably 4 to 10. The number of carbon atoms of the branched or cyclic alkoxy groups is, not including the number of carbon atoms of a substituent, usually 3 to 40, preferably 4 to 10.

The alkoxy group optionally has a substituent, and examples thereof include a methoxy group, an ethoxy group, a n-propyloxy group, an isopropyloxy group, a n-butyloxy group, an isobutyloxy group, a tert-butyloxy group, a n-pentyloxy group, a n-hexyloxy group, a cyclohexyloxy group, a n-heptyloxy group, a n-octyloxy group, a 2-ethylhexyloxy group, a n-nonyloxy group, a n-decyloxy group, a 3,7-dimethyloctyloxy group and a lauryloxy group.

The number of carbon atoms of "Aryloxy group" is, not including the number of carbon atoms of a substituent, usually 6 to 60, preferably 7 to 48.

The aryloxy group optionally has a substituent, and examples thereof include a phenoxy group, a 1-naphthyloxy group, a 2-naphthyloxy group, a 1-anthracenyloxy group, a 9-anthracenyloxy group, a 1-pyrenyloxy group, and groups obtained by substituting a hydrogen atom in these groups with an alkyl group, an alkoxy group, a fluorine atom or the like.

"p-Valent heterocyclic group" (p represents an integer of 1 or more) denotes an atomic group remaining after removing from a heterocyclic compound p hydrogen atoms among hydrogen atoms directly linked to a carbon atom or a hetero atom constituting the ring. Of p-valent heterocyclic groups, "p-valent aromatic heterocyclic groups" as an atomic group remaining after removing from an aromatic heterocyclic compound p hydrogen atoms among hydrogen atoms directly linked to a carbon atom or a hetero atom constituting the ring are preferable.

"Aromatic heterocyclic compound" denotes a compound in which the heterocyclic ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole and dibenzophosphole, and a compound in which an aromatic ring is condensed to the heterocyclic ring even if the heterocyclic ring itself shows no aromaticity such as phenoxazine, phenothiazine, dibenzoborole, dibenzosilole and benzopyran.

The number of carbon atoms of the monovalent heterocyclic group is, not including the number of carbon atoms of a substituent, usually 2 to 60, preferably 4 to 20.

The monovalent heterocyclic group optionally has a substituent, and examples thereof include a thienyl group, a pyrrolyl group, a furyl group, a pyridyl group, a piperidyl group, a quinolyl group, an isoquinolyl group, a pyrimidyl group, a triazinyl group, and groups obtained by substituting a hydrogen atom in these groups with an alkyl group, an alkoxy group or the like.

"Substituted amino group" is an amino group having two substituents. The substituent which the amino group has is preferably an alkyl group, an aryl group or a monovalent heterocyclic group.

The substituted amino group includes, for example, a dialkylamino group and a diarylamino group.

The amino group includes, for example, a dimethylamino group, a diethylamino group, a diphenylamino group, a bis(4-methylphenyl)amino group, a bis(4-tert-butylphenyl) amino group and a bis(3,5-di-tert-butylphenyl)amino group.

"Alkenyl group" may be any of linear, branched or cyclic. The number of carbon atoms of the linear alkenyl group, not including the number of carbon atoms of the substituent, is usually 2 to 30, preferably 3 to 20. The number of carbon atoms of the branched or cyclic alkenyl group, not including the number of carbon atoms of the substituent, is usually 3 to 30, preferably 4 to 20.

The alkenyl group optionally has a substituent, and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, and these groups having a substituent.

"Alkynyl group" may be any of linear, branched or cyclic. The number of carbon atoms of the alkynyl group, not including the number of carbon atoms of the substituent, is usually 2 to 20, preferably 3 to 20. The number of carbon atoms of the branched or cyclic alkynyl, not including the number of carbon atoms of the substituent, is usually 4 to 30, preferably 4 to 20.

The alkynyl group optionally has a substituent, and examples thereof include an ethynyl group, a 1-propynyl group, a 2-propynyl group, a 2-butynyl group, a 3-butynyl group, a 3-pentynyl group, a 4-pentynyl group, a 1-hexenyl group, a 5-hexenyl group, and these groups having a substituent.

"Arylene group" denotes an atomic group remaining after removing from an aromatic hydrocarbon two hydrogen atoms linked directly to carbon atoms constituting the ring. The number of carbon atoms of the arylene group is, not including the number of carbon atoms of a substituent, usually 6 to 60, preferably 6 to 30, more preferably 6 to 18.

The arylene group optionally has a substituent, and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group, a chrysenediyl group, and these groups having a substituent, preferably, groups represented by the formulae (A-1) to (A-20). The arylene group includes groups obtained by linking a plurality of these groups.

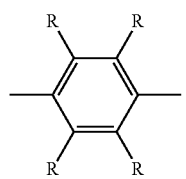

(A-1)

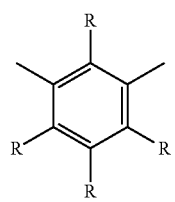

(A-2)

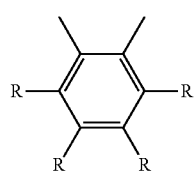

(A-3)

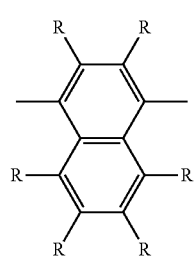

(A-4)

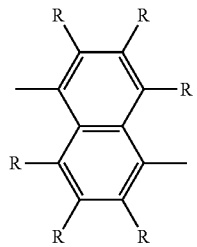

(A-5)

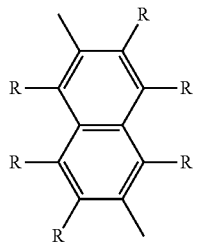

(A-6)

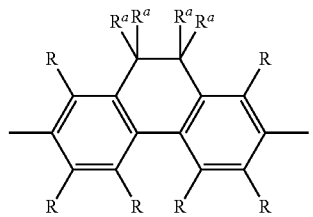

(A-7)

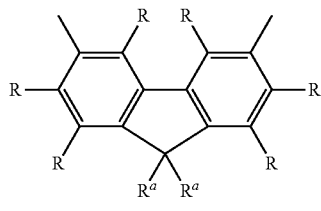

(A-8)

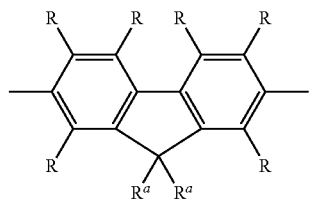

(A-9)

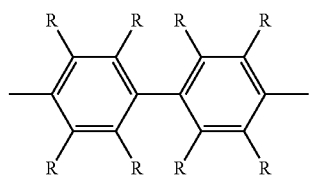

(A-10)

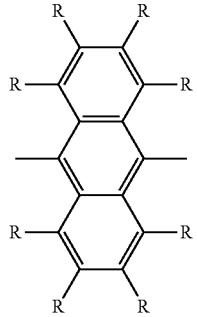

(A-11)

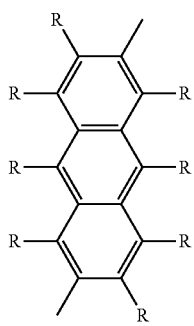

(A-12)

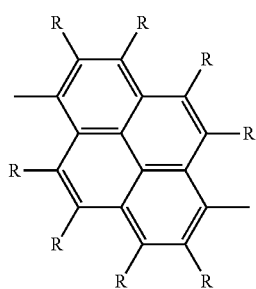

(A-13)

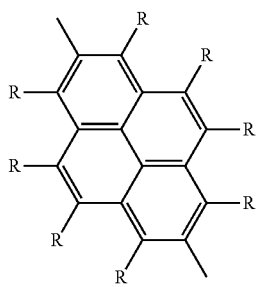

(A-14)

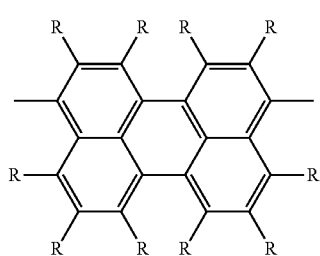

(A-15)

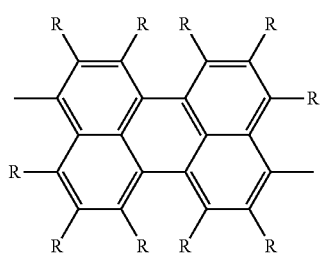

(A-16)

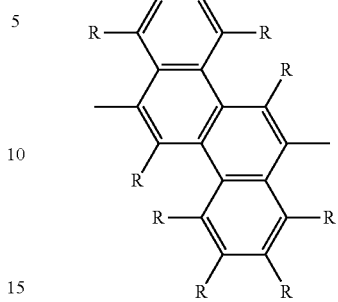

(A-17)

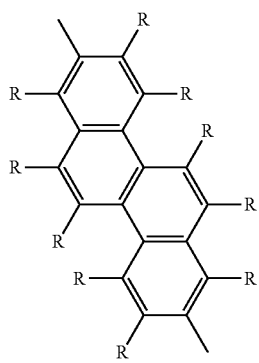

(A-18)

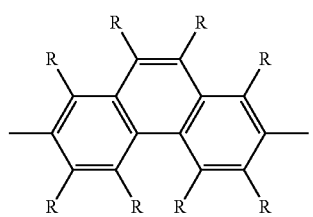

(A-19)

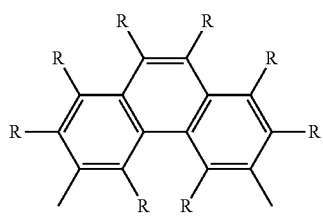

(A-20)

[wherein, R and $R^a$ each independently represent a hydrogen atom, an alkyl group or an aryl group. The Rs and $R^a$s each may be the same or different. Adjacent $R^a$s may be combined together to form a ring together with the atoms to which they are attached.]

The number of carbon atoms of the divalent heterocyclic group is, not including the number of carbon atoms of a substituent, usually 2 to 60, preferably 3 to 30, more preferably 4 to 15.

The divalent heterocyclic group optionally has a substituent, and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms linking directly to a carbon atom or a hetero atom constituting the ring, preferably groups represented by the formulae (A-21) to (A-52). The divalent heterocyclic group includes groups obtained by linking a plurality of these groups.
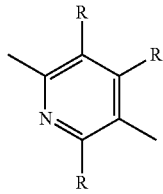
(A-21)
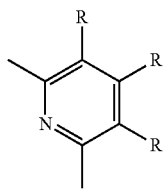
(A-22)
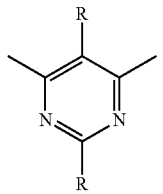
(A-23)
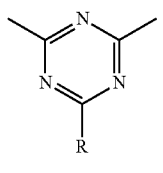
(A-24)
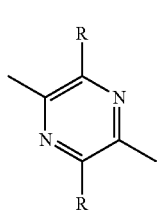
(A-25)
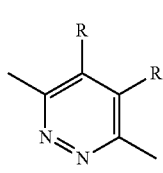
(A-26)
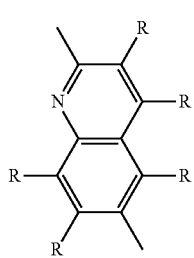
(A-27)
-continued
(A-28)
(A-29)
(A-30)
(A-31)
(A-32)
(A-33)
(A-34)
(A-35)

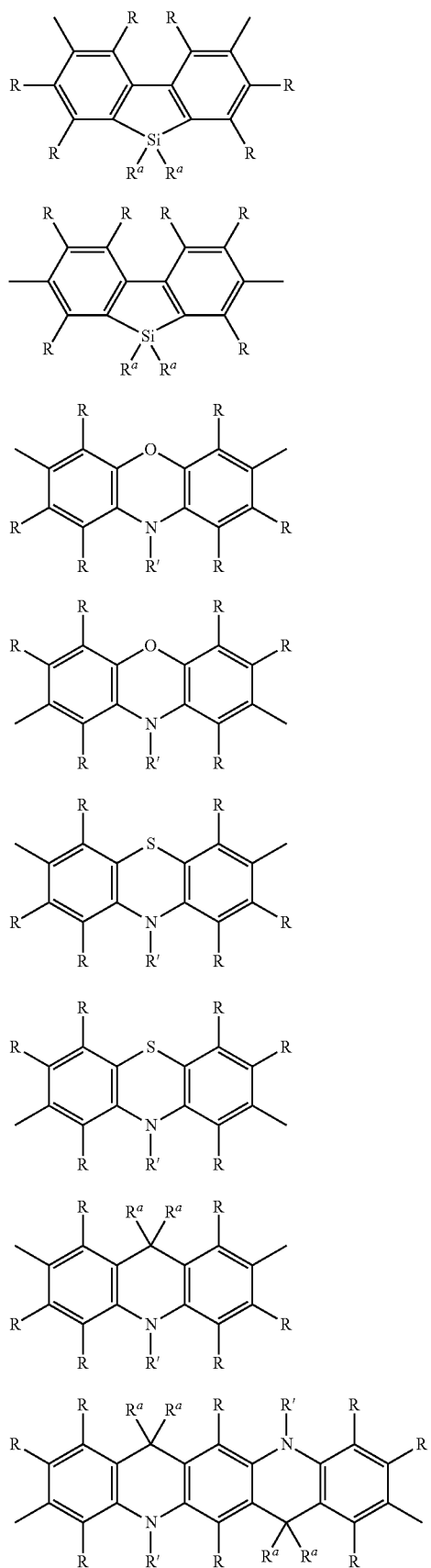
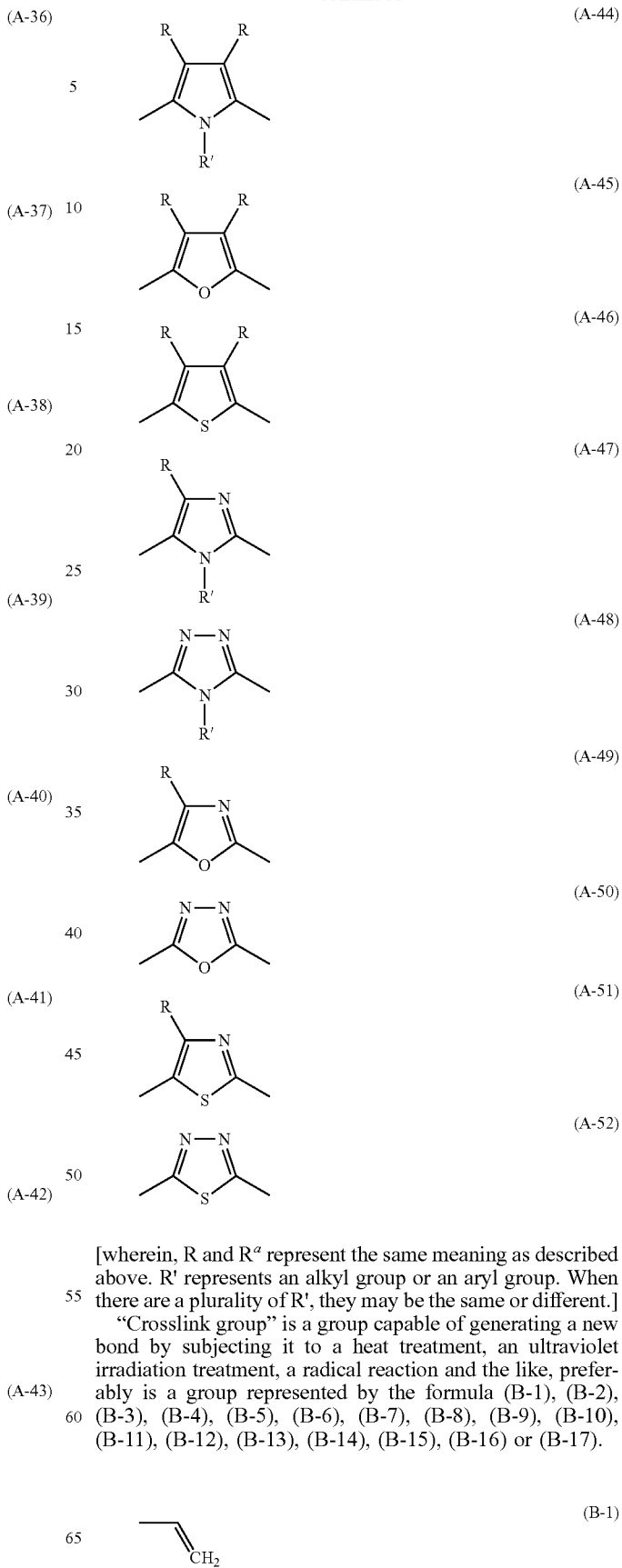

[wherein, R and $R^a$ represent the same meaning as described above. R' represents an alkyl group or an aryl group. When there are a plurality of R', they may be the same or different.]

"Crosslink group" is a group capable of generating a new bond by subjecting it to a heat treatment, an ultraviolet irradiation treatment, a radical reaction and the like, preferably is a group represented by the formula (B-1), (B-2), (B-3), (B-4), (B-5), (B-6), (B-7), (B-8), (B-9), (B-10), (B-11), (B-12), (B-13), (B-14), (B-15), (B-16) or (B-17).

(B-1)

-continued

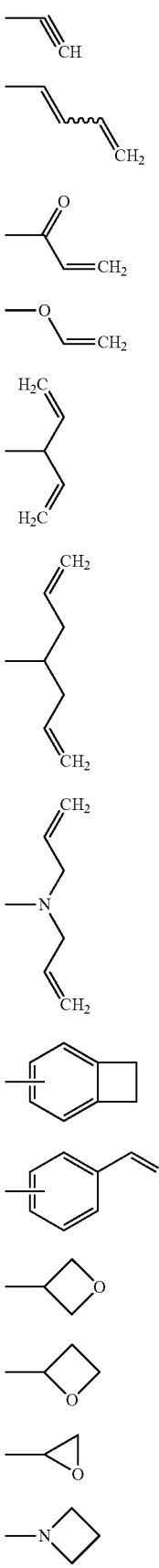

(B-2)
(B-3)
(B-4)
(B-5)
(B-6)
(B-7)
(B-8)
(B-9)
(B-10)
(B-11)
(B-12)
(B-13)
(B-14)

-continued

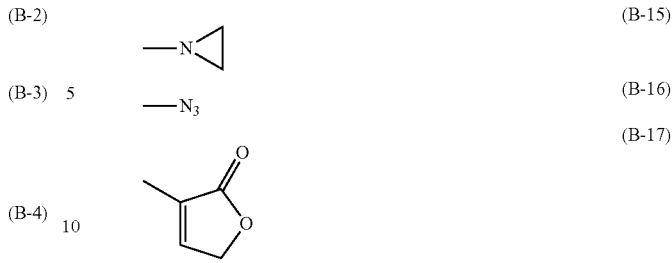

(B-15)
(B-16)
(B-17)

[wherein, these groups each optionally have a substituent.].

"Substituent" represents a fluorine atom, a cyano group, an alkyl group, an aryl group, a monovalent heterocyclic group, an alkoxy group, an aryloxy group, a substituted amino group, an alkenyl group or an alkynyl group. The substituent may be a crosslink group.

<Polymer Compound>

The polymer compound of the present invention is a polymer compound comprising a constitutional unit represented by the above-described formula (1), and a constitutional unit represented by the above-described formula (X) and/or a constitutional unit represented by the above-described formula (Y) (differing from the constitutional unit represented by the formula (1)), wherein the content of the hydroxyl groups contained in the polymer compound is less than 0.02 mol %.

[Constitutional Unit Represented by the Formula (1)]

 (1)

The arylene group represented by $Ar^1$ is more preferably a group represented by the formula (A-1), the formula (A-7), the formula (A-9) or the formula (A-10), further preferably a group represented by the formula (A-1), the formula (A-7) or the formula (A-9), and these groups each optionally have a substituent.

The constitutional unit represented by the formula (1) is preferably a constitutional unit represented by the formula (1-1) or the formula (1-2) because the luminance life of a light emitting device using the polymer compound of the present invention is more excellent.

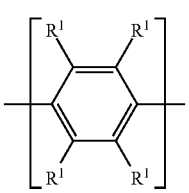 (1-1)

[wherein, $R^1$ represents a hydrogen atom, an alkyl group, an alkoxy group, an aryl group or a monovalent heterocyclic group and these groups each optionally have a substituent. The $R^1$s may be the same or different and adjacent $R^1$s may be combined together to form a ring together with the carbon atoms to which they are attached.].

$R^1$ is preferably a hydrogen atom, an alkyl group or an aryl group, more preferably a hydrogen atom or an alkyl group, and these groups each optionally have a substituent.

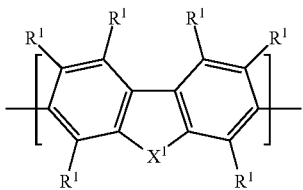
(1-2)

[wherein,

R¹ represents the same meaning as described above.

X¹ represents a group represented by —C(R²)₂—, —C(R²)=C(R²)- or C(R²)₂—C(R²)₂—. R² represents a hydrogen atom, an alkyl group, an alkoxy group, an aryl group or a monovalent heterocyclic group and these groups each optionally have a substituent. The R²s may be the same or different and the R²s may be combined together to form a ring together with the carbon atoms to which they are attached.].

R² is preferably an alkyl group, an aryl group or a monovalent heterocyclic group, more preferably an alkyl group or an aryl group, and these groups each optionally have a substituent. R² is further preferably an alkyl group, or an aryl group in which part or all of hydrogen atoms are substituted with alkyl groups.

When R² is an aryl group in which part or all of hydrogen atoms are substituted with alkyl groups, the alkyl groups may be combined together to form a ring together with the carbon atoms to which they are attached. The aryl group includes, for example, a group represented by the formula (B-9).

Regarding the combination of two R² in the group represented by —C(R²)₂— in X¹, it is preferable that the both are an alkyl group, the both are an aryl group, the both are a monovalent heterocyclic group, or one is an alkyl group and the other is an aryl group or a monovalent heterocyclic group, it is more preferable that one is an alkyl group and the other is an aryl group, and these groups each optionally have a substituent. The two groups R² may be combined together to form a ring together with the atoms to which they are attached, and when the groups R² form a ring, the group represented by —C(R²)₂— is preferably a group represented by the formulae (1-A1) to (1-A5), more preferably a group represented by the formula (1-A4), and these groups each optionally have a substituent.

(1-A1)

(1-A2)

(1-A3)

(1-A4)

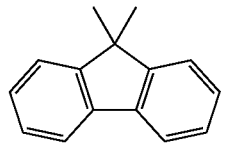

(1-A5)

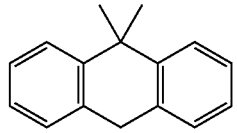

Regarding the combination of two R²s in the group represented by —C(R²)=C(R²)— in X¹, it is preferable that the both are an alkyl group, or one is an alkyl group and the other is an aryl group, and these groups each optionally have a substituent.

Four R²s in the group represented by —C(R²)₂—C(R²)₂— in X¹ are preferably an alkyl group which optionally has a substituent. The plurality of R² may be combined together to form a ring together with the atoms to which they are attached, and when the groups R² form a ring, the group represented by —C(R²)₂—C(R²)₂— is preferably a group represented by the formulae (1-B1) to (1-B5), more preferably a group represented by the formula (1-B3), and these groups each optionally have a substituent.

(1-B1)

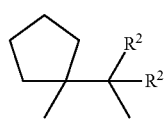

(1-B2)

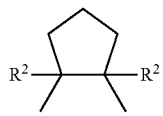

(1-B3)

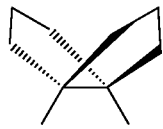

(1-B4)

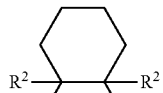

(1-B5)

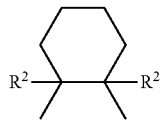

[wherein, R² represents the same meaning as described above.].

The total amount of constitutional units represented by the formula (1) is preferably 20 to 90 mol %, more preferably 25 to 80 mol %, further preferably 30 to 70 mol % with respect to the total amount of constitutional units contained in the polymer compound because the stability of the polymer compound of the present invention is excellent.

The constitutional unit represented by the formula (1) includes, for example, constitutional units represented by the formulae (1-11) to (1-46), preferably constitutional units represented by the formulae (1-11) to (1-36).
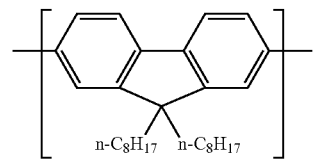
(1-11)
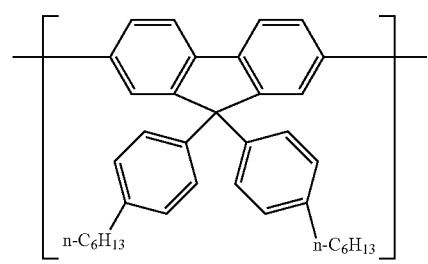
(1-12)
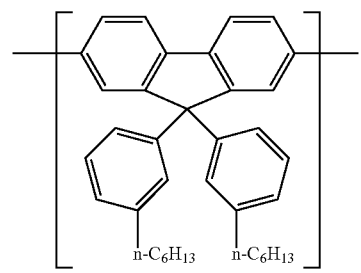
(1-13)
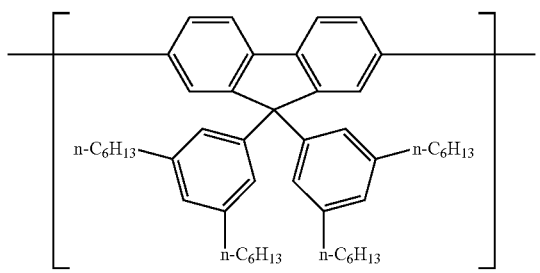
(1-14)
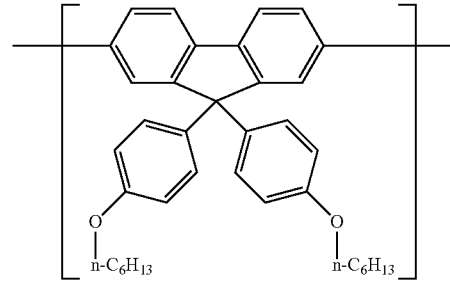
(1-15)
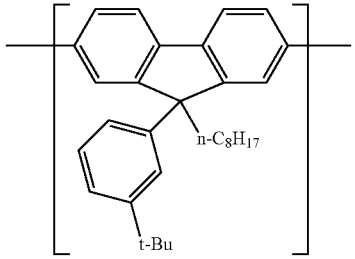
(1-16)
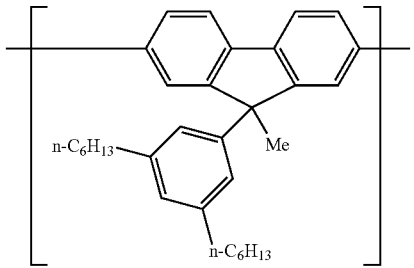
(1-17)
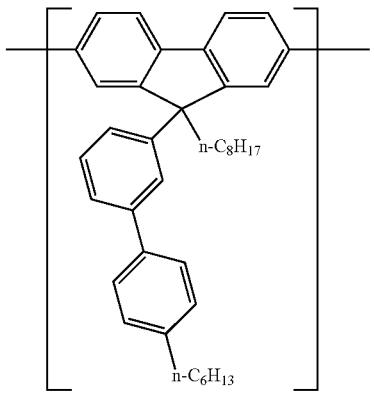
(1-18)
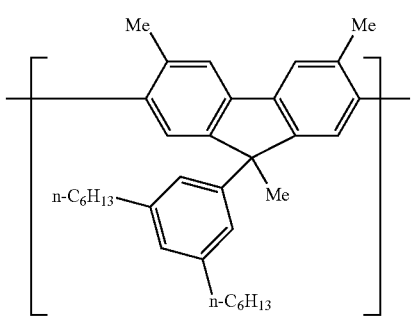
(1-19)
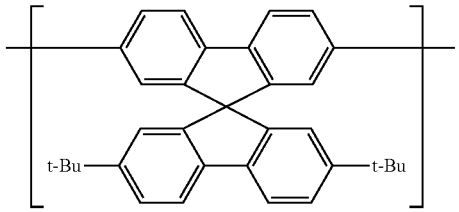
(1-20)
(1-21)

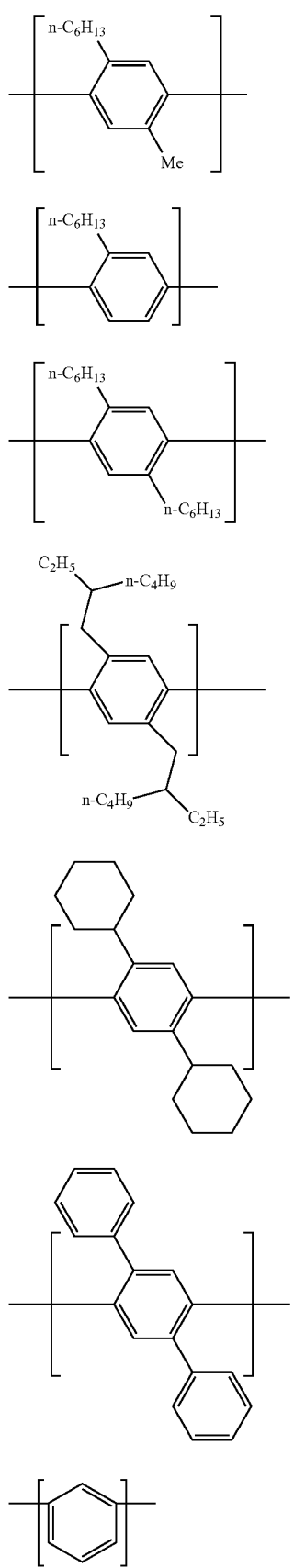
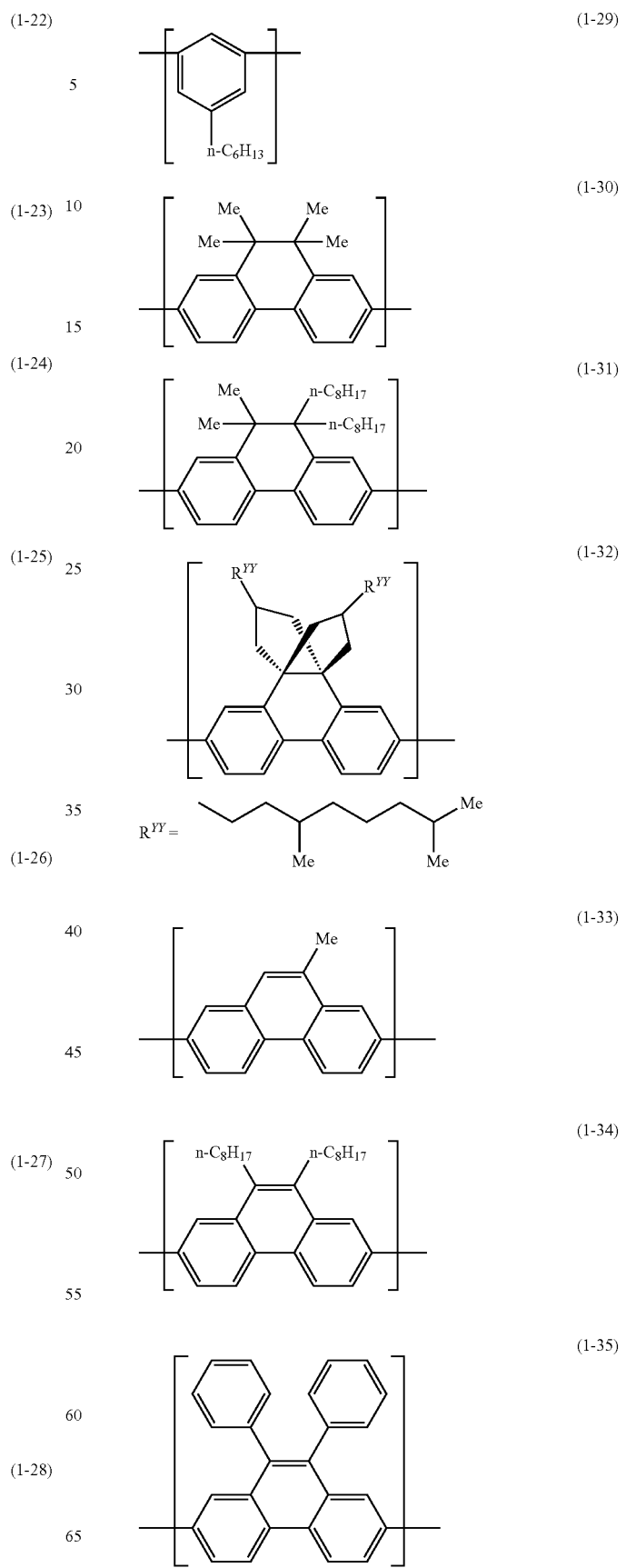

(1-36)
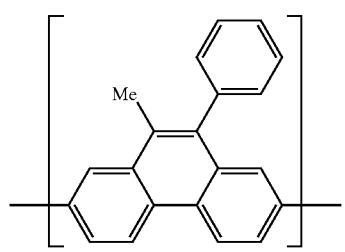
(1-37)
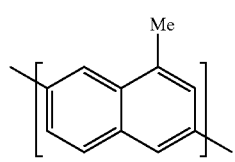
(1-38)
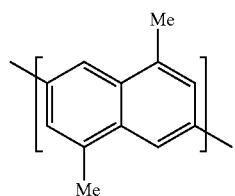
(1-39)
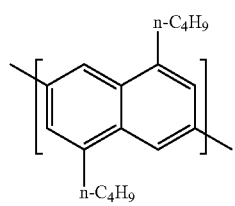
(1-40)
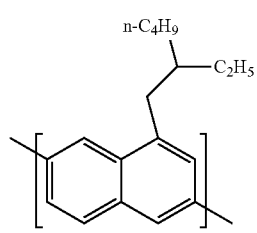
(1-41)
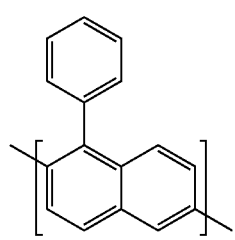
(1-42)
(1-43)
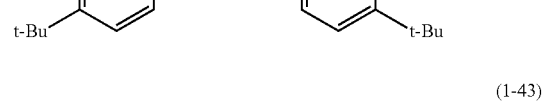
(1-44)
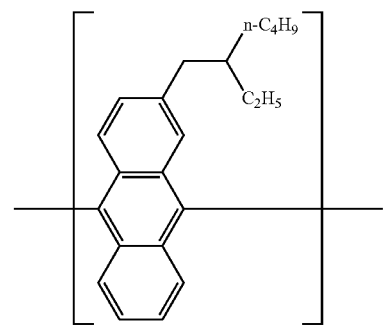
(1-45)
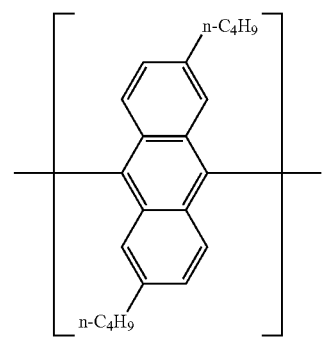

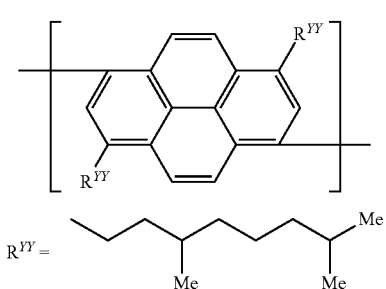

(1-46)

$R^{YY}$ = 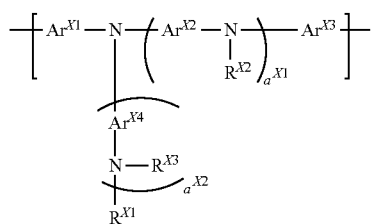

[Constitutional unit represented by the formula (X)]

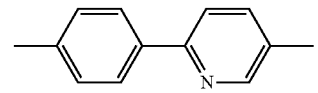
(X)

$a^{X1}$ is preferably an integer of 2 or less, more preferably 1 because the luminance life of a light emitting device using the polymer compound of the present invention is more excellent.

$a^{X2}$ is preferably an integer of 2 or less, more preferably 0 because the luminance life of a light emitting device using the polymer compound of the present invention is more excellent.

$R^{X1}$, $R^{X2}$ and $R^{X3}$ are preferably an aryl group, and these groups each optionally have a substituent.

The arylene group represented by $Ar^{X1}$ and $Ar^{X3}$ is more preferably a group represented by the formula (A-1) or the formula (A-9), further preferably a group represented by the formula (A-1), and these groups each optionally have a substituent.

The divalent heterocyclic group represented by $Ar^{X1}$ and $Ar^{X3}$ is more preferably a group represented by the formula (A-21), the formula (A-22) or the formulae (A-27) to (A-46), and these groups each optionally have a substituent.

$Ar^{X1}$ and $Ar^{X3}$ are preferably an arylene group which optionally has a substituent.

The arylene group represented by $Ar^{X2}$ and $Ar^{X4}$ is particularly preferably a group represented by the formula (A-1), the formula (A-6), the formula (A-7), the formulae (A-9) to (A-11) or the formula (A-19), and these groups each optionally have a substituent.

The more preferable range of the divalent heterocyclic group represented by $Ar^{X2}$ and $Ar^{X4}$ is the same as the more preferable range of the divalent heterocyclic group represented by $Ar^{X1}$ and $Ar^{X3}$.

The more preferable range and the further preferable range of the arylene group and the divalent heterocyclic group in the divalent group obtained by directly bonding at least one arylene group and at least one divalent heterocyclic group represented by $Ar^{X2}$ and $Ar^{X4}$ are the same as the more preferable range and the further preferable range of the arylene group and the divalent heterocyclic group represented by $Ar^{X1}$ and $Ar^{X3}$, respectively.

The divalent group in which at least one arylene group and at least one divalent heterocyclic group are bonded directly to each other represented by $Ar^{X2}$ and $Ar^{X4}$ includes, for example, groups represented by the following formulae, and they each optionally have a substituent.

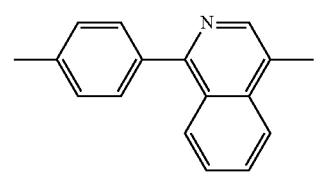

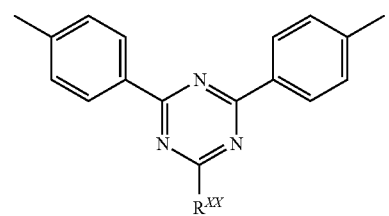

[wherein, $R^{XX}$ represents a hydrogen atom, an alkyl group, an aryl group or a monovalent heterocyclic group and these groups each optionally have a substituent.].

$R^{XX}$ is preferably an alkyl group or an aryl group, and these groups each optionally have a substituent.

$Ar^{X2}$ and $Ar^{X4}$ are preferably an arylene group which optionally has a substituent.

The substituent which the group represented by $Ar^{X1}$ to $Ar^{X4}$ and $R^{X1}$ to $R^{X3}$ each optionally have is preferably an alkyl group or an aryl group, and these groups optionally further have a substituent.

The constitutional unit represented by the formula (X) includes preferably constitutional units represented by the formulae (X-1) to (X-7), more preferably constitutional units represented by the formulae (X-3) to (X-7), further preferably constitutional units represented by the formulae (X-3) to (X-6).

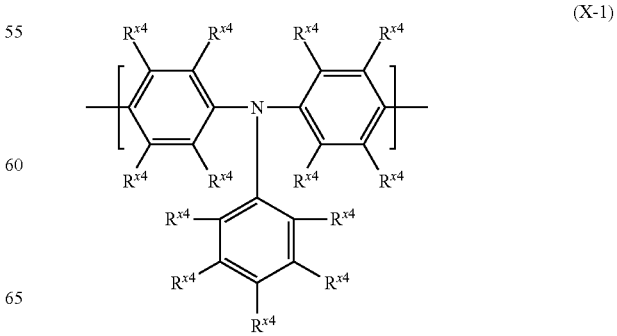
(X-1)

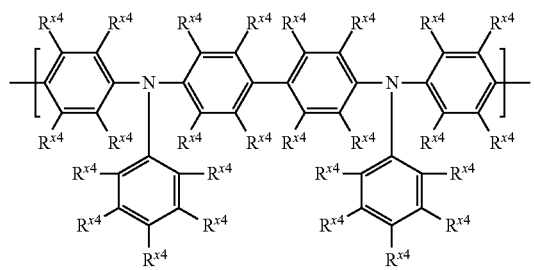
(X-2)

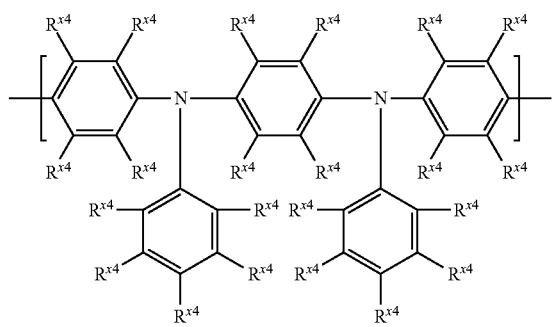
(X-3)

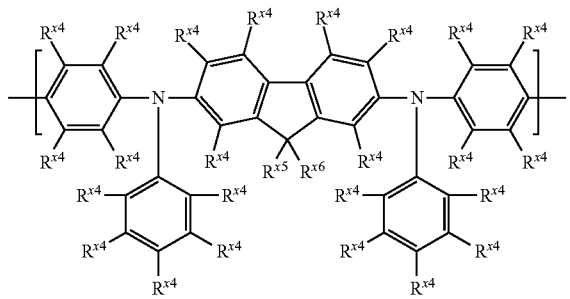
(X-4)

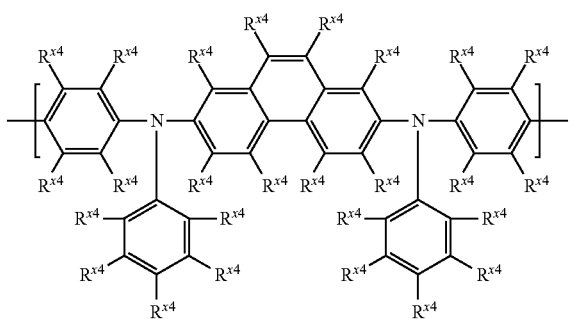
(X-5)

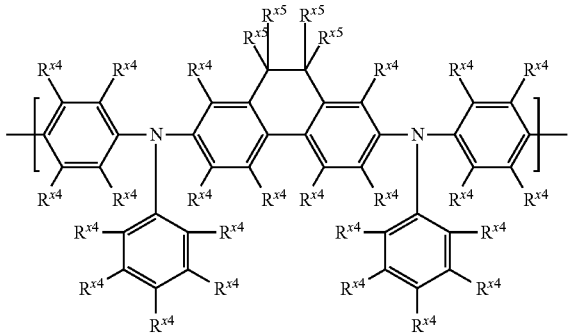
(X-6)

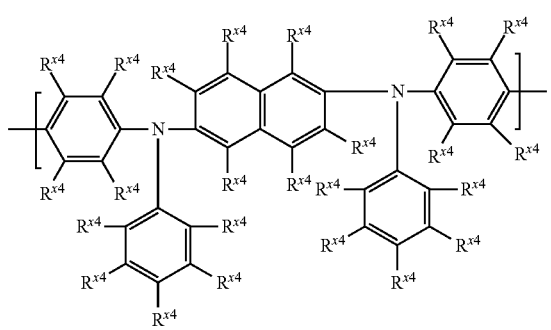
(X-7)

[wherein, $R^{X4}$ and $R^{X5}$ each independently represent a hydrogen atom, an alkyl group, an alkoxy group, an aryl group, an aryloxy group, a fluorine atom, a monovalent heterocyclic group or a cyano group, preferably a hydrogen atom or an alkyl group, and these groups each optionally have a substituent. The $R^{X4}$s may be the same or different. The $R^{X5}$s may be the same or different and adjacent $R^{X5}$s may be combined together to form a ring together with the carbon atoms to which they are attached.].

The amount of the constitutional unit represented by the formula (X) is preferably 0.1 to 50 mol %, more preferably 1 to 40 mol %, further preferably 5 to 30 mol % with respect to the total amount of constitutional units contained in the polymer compound because hole transportability is excellent.

The constitutional unit represented by the formula (X) includes, for example, constitutional units represented by the formulae (X1-1) to (X1-19), preferably constitutional units represented by the formulae (X1-6) to (X1-14).

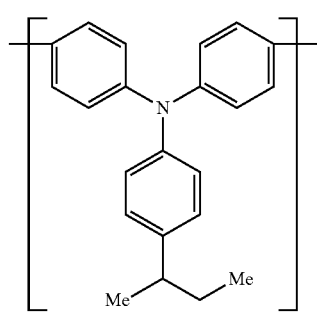
(X1-1)

(X1-2) 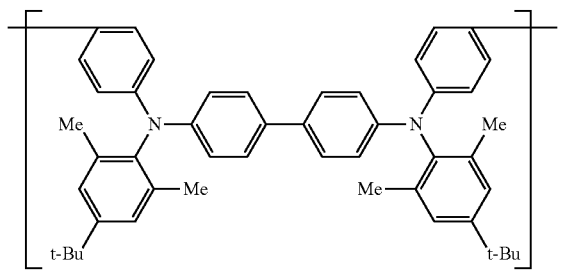
(X1-3) 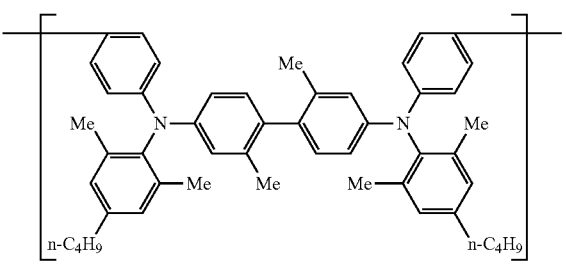
(X1-4) 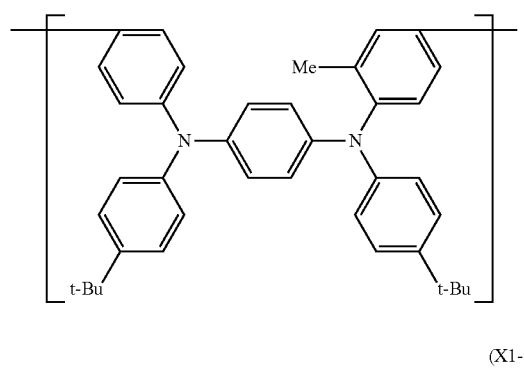
(X1-5) 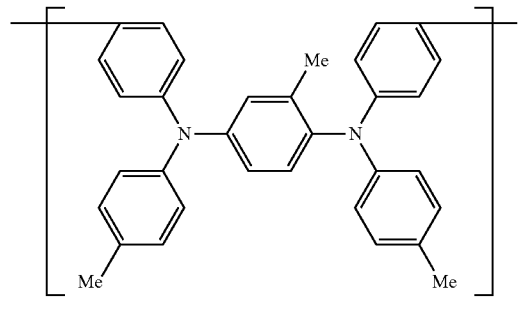
(X1-6) 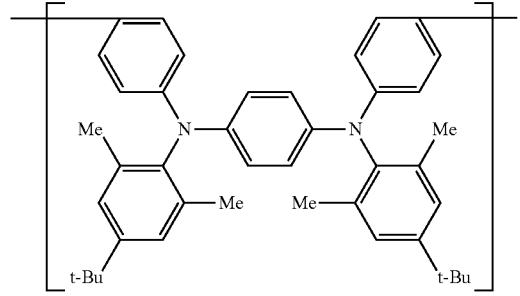
(X1-7) 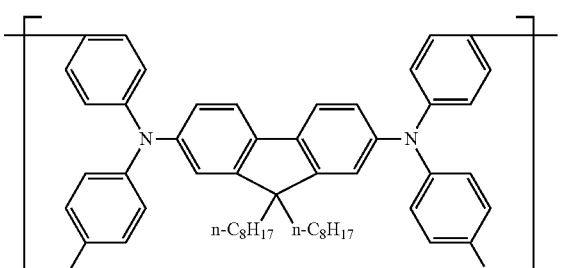
(X1-8) 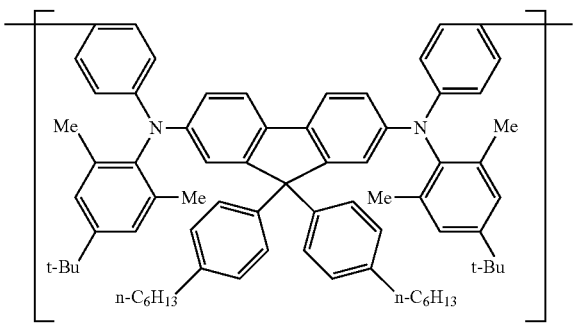
(X1-9) 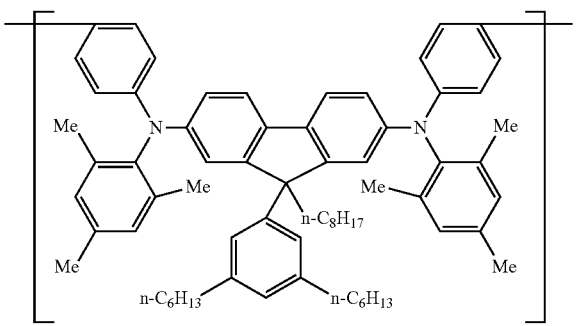
(X1-10) 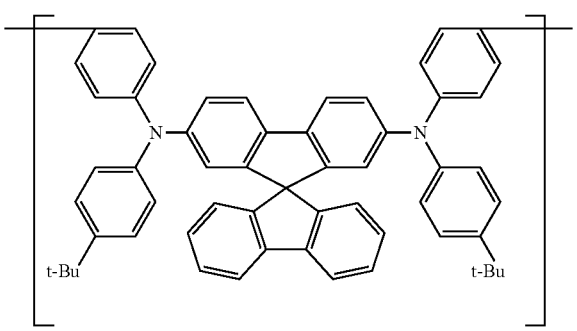
(X1-11) 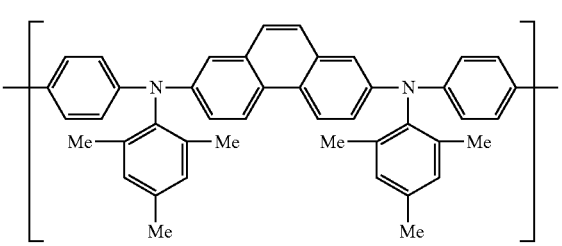

-continued
(X1-12)
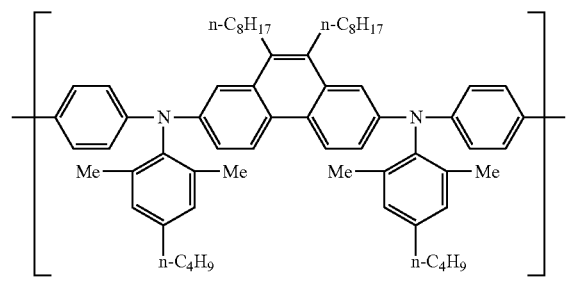
(X1-13)
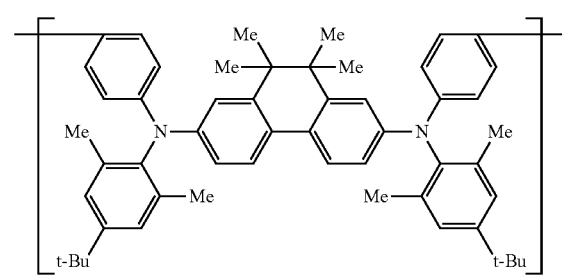
(X1-14)
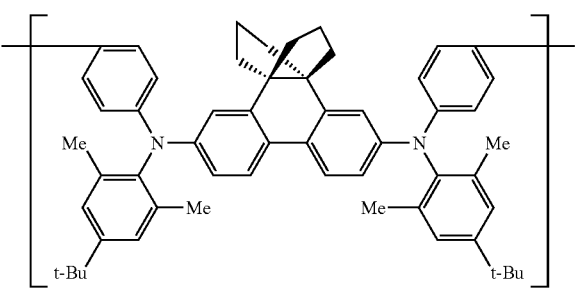
(X1-15)
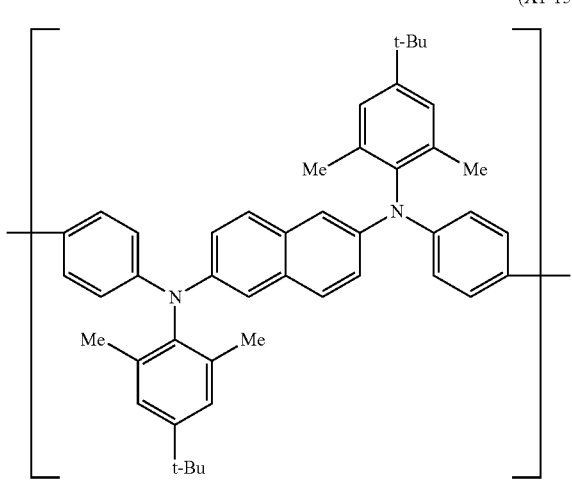
-continued
(X1-16)
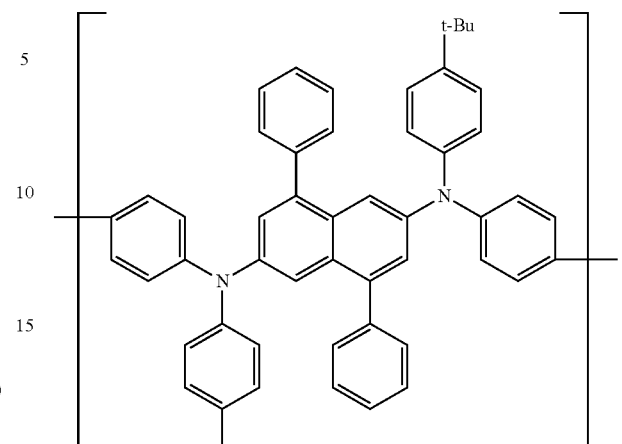
(X1-17)
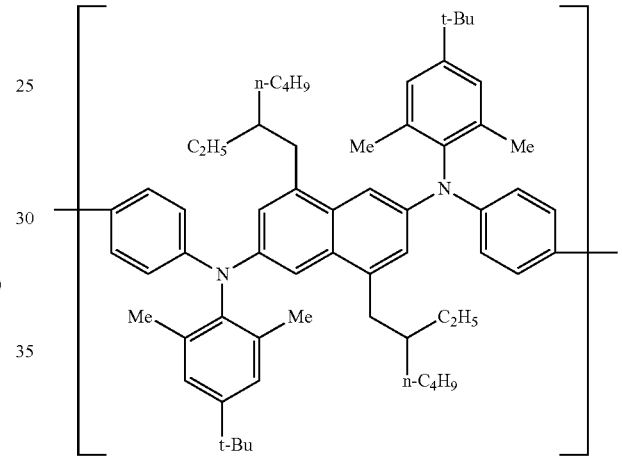
(X1-18)
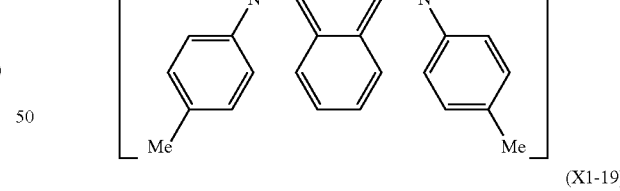
(X1-19)
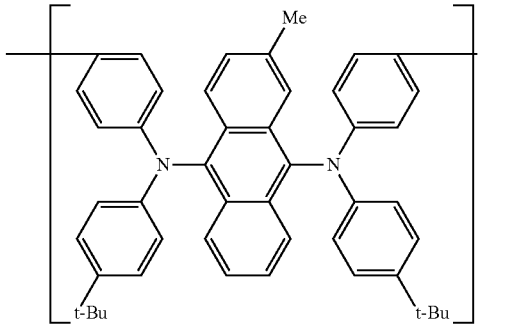

In the polymer compound of the present invention, the constitutional units represented by the formula (X) may be contained singly or in combination.

[Constitutional Unit Represented by the Formula (Y)]

 (Y)

Since the constitutional unit represented by the formula (Y) is different from the constitutional unit represented by the formula (1), when $Ar^{Y1}$ in the formula (Y) is an arylene group, this arylene group is different from the arylene group represented by $Ar^1$ in the formula (1).

The arylene group represented by $Ar^{Y1}$ is more preferably a group represented by the formula (A-6), the formula (A-11), the formula (A-13) or the formula (A-19), further preferably a group represented by the formula (A-11) or the formula (A-13), and these groups each optionally have a substituent.

The divalent heterocyclic group represented by $Ar^{Y1}$ is more preferably a group represented by the formula (A-24), the formula (A-30), the formula (A-33), the formula (A-35), the formula (A-38) or the formula (A-40), further preferably a group represented by the formula (A-24), the formula (A-30), the formula (A-38) or the formula (A-40), and these groups each optionally have a substituent.

The more preferable range and further preferable range of an arylene group and a divalent heterocyclic group in the divalent group in which at least one arylene group and at least one divalent heterocyclic group are bonded directly to each other represented by $Ar^{Y1}$ are the same as the more preferable range and further preferable range of the above-described arylene group and divalent heterocyclic group represented by $Ar^{Y1}$.

The substituent which the group represented by $Ar^{Y1}$ optionally has is preferably an alkyl group or an aryl group, and these groups optionally further have a substituent.

The constitutional unit represented by the formula (Y) includes, for example, constitutional units represented by the formulae (Y-3) to (Y-7), and from the standpoint of the electron transportability of the polymer compound of the present invention, preferably includes constitutional units represented by the formula (Y-3) or (Y-4), and from the standpoint of the hole transportability thereof, preferably includes constitutional units represented by the formulae (Y-5) to (Y-7).

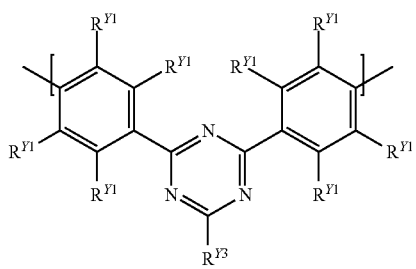 (Y-3)

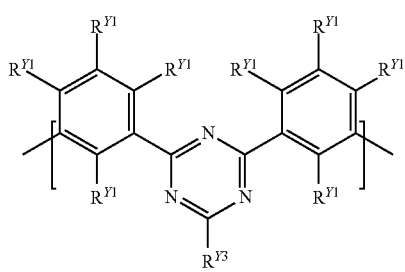 (Y-4)

[wherein, $R^{Y1}$ represents a hydrogen atom, an alkyl group, an alkoxy group, an aryl group or a monovalent heterocyclic group and these groups each optionally have a substituent. The $R^{Y1}$s may be the same or different and adjacent $R^{Y1}$s may be combined together to form a ring together with the carbon atoms to which they are attached.

$R^{Y3}$ represents a hydrogen atom, an alkyl group, an alkoxy group, an aryl group or a monovalent heterocyclic group and these groups each optionally have a substituent.].

$R^{Y1}$ is preferably a hydrogen atom, an alkyl group or an aryl group, more preferably a hydrogen atom, and these groups each optionally have a substituent.

$R^{Y3}$ is preferably an alkyl group, an alkoxy group, an aryl group or a monovalent heterocyclic group, more preferably an aryl group, and these groups each optionally have a substituent. $R^{Y3}$ is further preferably an aryl group in which part or all of hydrogen atoms are substituted with alkyl groups.

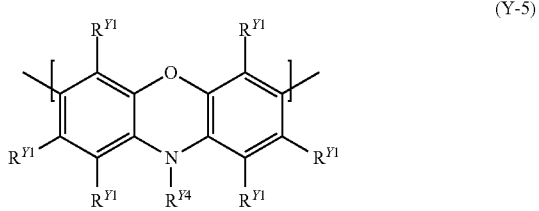 (Y-5)

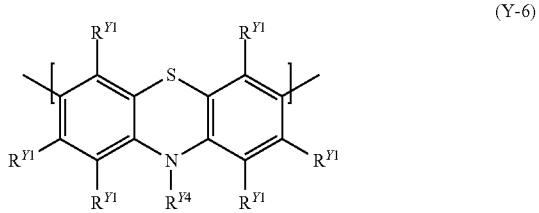 (Y-6)

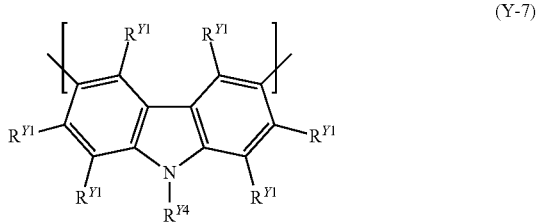 (Y-7)

[wherein, $R^{Y1}$ represents the same meaning as described above.

$R^{Y4}$ represents an alkyl group, an alkoxy group, an aryl group or a monovalent heterocyclic group and these groups each optionally have a substituent.].

$R^{Y4}$ is preferably an aryl group, and these groups each optionally have a substituent.

The constitutional unit represented by the formula (Y) includes, for example, constitutional units represented by the formulae (1-11) to (1-46) and constitutional units represented by the formulae (Y-11) to (Y-19), preferably constitutional units represented by the formulae (1-37) to (1-46) or constitutional units represented by the formulae (Y-11) to (Y-19).

(Y-11) 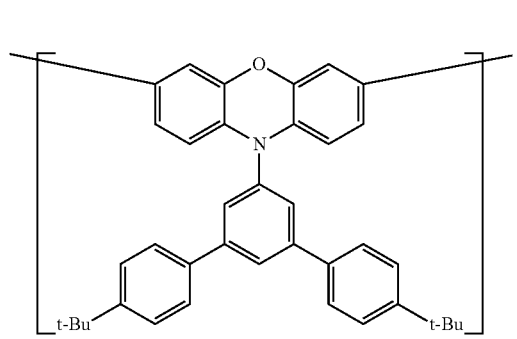
(Y-12) 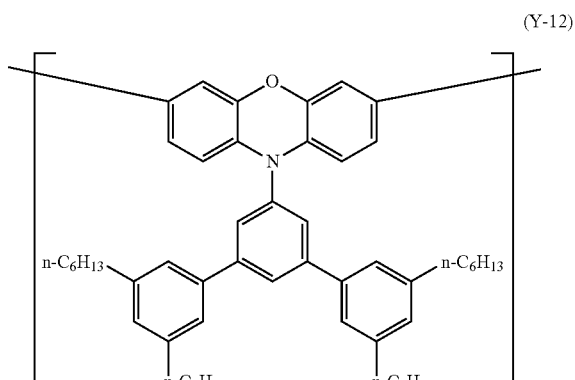
(Y-13) 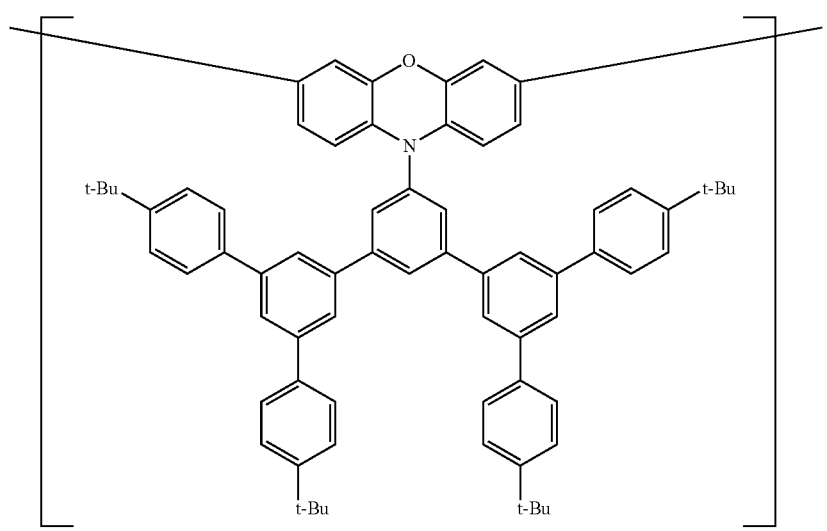
(Y-14) 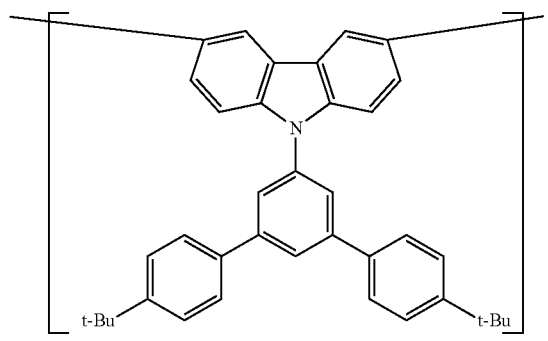
(Y-15) 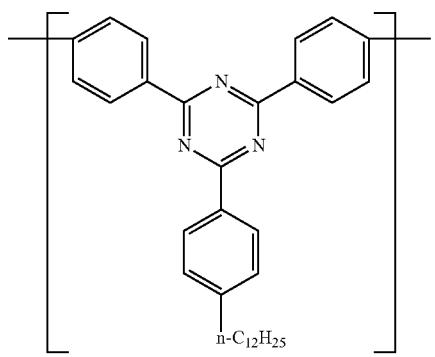
(Y-16) 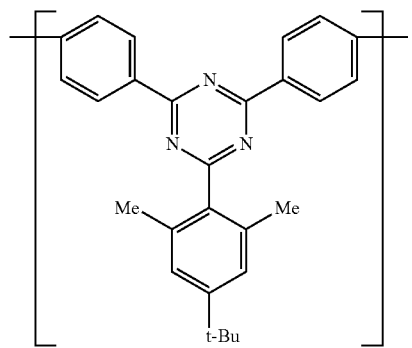
(Y-17) 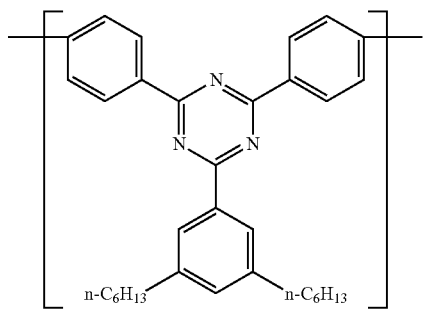

-continued

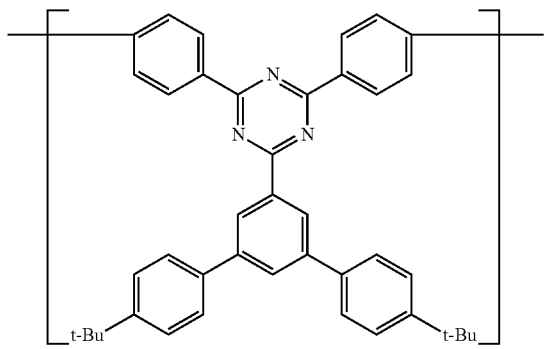
(Y-18)

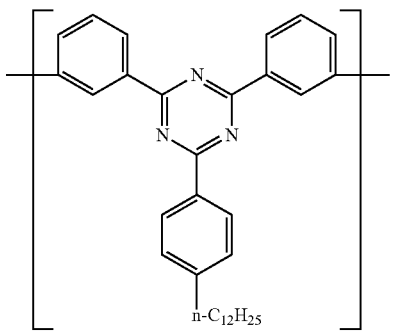
(Y-19)

The amount of the constitutional unit represented by the formula (Y) in which $Ar^{Y1}$ is an arylene group is preferably 0.5 to 80 mol %, more preferably 30 to 60 mol % with respect to the total amount of constitutional units contained in the polymer compound, because the luminance life of a light emitting device using the polymer compound of the present invention is more excellent.

The amount of the constitutional unit represented by the formula (Y) in which $Ar^{Y1}$ is a divalent heterocyclic group or a divalent group in which at least one arylene group and at least one divalent heterocyclic group are bonded directly to each other is preferably 0.5 to 30 mol %, more preferably 3 to 40 mol % with respect to the total amount of constitutional units contained in the polymer compound, because the charge transportability of a light emitting device using the polymer compound of the present invention is excellent.

The constitutional units represented by the formula (Y) may be contained singly or in combination in the polymer compound.

The polymer compound of the present invention includes, for example, polymer compounds P-101 to P-103 in Table 1. Here, "other" constitutional units denote constitutional units other than the constitutional unit represented by the formula (1), the constitutional unit represented by the formula (X) and the constitutional unit represented by the formula (Y).

TABLE 1

| Polymer compound | Constitutional unit and molar ratio thereof | | | |
|---|---|---|---|---|
| | formula (1) formulae (1-1) to (1-2) p | formula (X) formulae (X-1) to (X-7) q | formula (Y) formulae (Y-3) to (Y-7) r | Others s |
| P-101 | 0.1 to 99.9 | 0.1 to 99.9 | 0 | 0 to 30 |
| P-102 | 0.1 to 99.9 | 0 | 0.1 to 99.9 | 0 to 30 |
| P-103 | 0.1 to 99.8 | 0.1 to 99.8 | 0.1 to 99.8 | 0 to 30 |

[in the table, p, q, r and s represent the molar ratio of each constitutional unit. p + q + r + s = 100 and 100 ≥ p + q + r ≥ 70. Other constitutional units denote constitutional units other than the constitutional unit represented by the formula (1), the constitutional unit represented by the formula (X) and the constitutional unit represented by the formula (Y).].

The polymer compound of the present invention may be any of a block copolymer, a random copolymer, an alternate copolymer and a graft copolymer, and may also be another form.

[Content of Hydroxyl Groups]

The content of the hydroxyl groups contained in a polymer compound is the amount of constitutional units having a hydroxyl group with respect to the total amount of constitutional units contained in the polymer compound, and represented by mol %. The content of the hydroxyl groups contained in a polymer compound can be measured, for example, by proton NMR.

It is because the constitutional unit having a hydroxyl group generated during synthesis of a polymer compound can be identified and its content can be quantified by the spectrum of proton NMR and the structures of raw material monomers used for synthesis of the polymer compound.

Proton NMR is generally capable of observing a proton of a hydroxyl group directly. When a peak of a proton of a hydroxyl group overlaps with a peak of a different proton, a constitutional unit having the hydroxyl group can be estimated from the structure of a raw material monomer used for the synthesis of a polymer compound. In addition, a constitutional unit having a hydroxyl group generated during the synthesis of the polymer compound can be identified and the content thereof can be determined from the proton NMR spectrum, peaks of which have been measured with respect to protons attached to a carbon atom at the ortho position relative to a carbon atom to which the hydroxyl group attaches.

The content of the hydroxyl groups contained in the polymer compound of the present invention is less than 0.02 mol %, and it is preferably less than 0.01 mol %, because the luminance life of a light emitting device using the polymer compound of the present invention is more excellent.

[Content of Atoms and Groups]

The content of the chlorine atoms contained in the polymer compound of the present invention is preferably less than 10 ppm, more preferably less than 5 ppm by weight, because the luminance life of a light emitting device using the polymer compound of the present invention is more excellent.

The content of the bromine atoms contained in the polymer compound of the present invention is preferably less than 10 ppm, more preferably less than 5 ppm by weight, because the luminance life of a light emitting device using the polymer compound of the present invention is more excellent.

The content of then iodine atoms contained in the polymer compound of the present invention is preferably less than 10 ppm, more preferably less than 5 ppm by weight, because the luminance life of a light emitting device using the polymer compound of the present invention is more excellent.

The content of the palladium atoms contained in the polymer compound of the present invention is preferably less than 100 ppm, more preferably less than 50 ppm by weight, further preferably less than 10 ppm by weight, because the luminance life of a light emitting device using the polymer compound of the present invention is more excellent. The palladium atom contained in the polymer compound of the present invention may be one contained in the form of the other molecule than the polymer compound, one which a constitutional unit contained in the polymer compound carries, or one incorporated into the polymer compound via a coordination bond or the like.

The content of the phosphorus atoms contained in the polymer compound of the present invention is preferably less than 100 ppm, more preferably less than 50 ppm by weight, further preferably less than 10 ppm by weight, because the luminance life of a light emitting device using the polymer compound of the present invention is more excellent. The phosphorus atom contained in the polymer compound of the present invention may be one contained in the form of the other molecule than the polymer compound, one which a constitutional unit contained in the polymer compound carries, or one incorporated into the polymer compound via a coordination bond or the like.

The content of the groups represented by —$NH_2$, the content of the groups represented by —$NHR^Z$ ($R^Z$ represents a substituent) and the content of the groups represented by —NH—, contained in the polymer compound of the present invention, are each preferably less than 0.1 mol %, more preferably less than 0.02 mol %, further preferably less than 0.01 mol %, because the luminance life of a light emitting device using the polymer compound of the present invention is more excellent.

The content of the groups represented by —$NH_2$, the content of the groups represented by —$NHR^Z$ and the content of the groups represented by —NH—, contained in the polymer compound, are the amount of a constitutional unit having the group represented by —$NH_2$, the amount of a constitutional unit having the group represented by —$NHR^Z$ and the amount of a constitutional unit having the group represented by —NH—, respectively, with respect to the total amount of constitutional units contained in the polymer compound, and represented by mol %. The content of the groups represented by —$NH_2$, the content of the groups represented by —$NHR^Z$ and the content of the groups represented by —NH—, contained in the polymer compound, can be measured, for example, by proton NMR. The measurement method is the same as the measurement method of the content of the hydroxyl groups described above.

<Method for Producing Polymer Host>

Next, the method for producing the polymer compound of the present invention will be explained.

The polymer compound of the present invention can be produced, for example, by condensation-polymerizing a compound represented by the following formula (M-1), and a compound represented by the following formula (M-X) and/or a compound represented by the following formula (M-Y) (differing from the compound represented by the formula (M-1)) under the condition of an oxygen concentration of less than 0.5% by volume (hereinafter, referred to also as "First production method for the polymer compound of the present invention").

In the present specification, compounds used for production for the polymer compound of the present invention are collectively called "raw material monomer" in some cases.

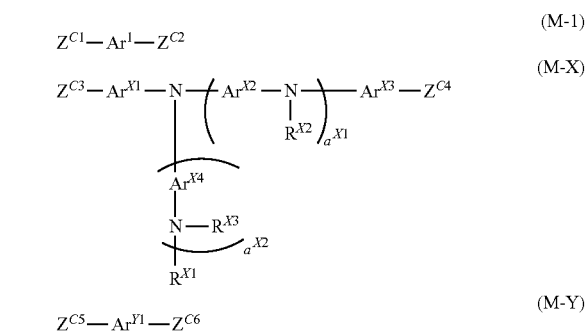

In the method for producing the polymer compound of the present invention, the oxygen concentration is preferably less than 0.2%, more preferably less than 0.05% by volume, because the content of the hydroxyl groups contained in the polymer compound can be reduced more.

Further, the polymer compound of the present invention can also be produced, for example, by condensation-polymerizing a compound represented by the above-described formula (M-1) and, a compound represented by the above-described formula (M-X), a compound represented by the above-described formula (M-Y) or both a compound represented by the above-described formula (M-X) and a compound represented by the above-described formula (M-Y) (that is, a compound represented by the above-described formula (M-X) and/or a compound represented by the above-described formula (M-Y)), then, reacting the condensation polymer with a compound represented by the following formula (2) (hereinafter, referred to also as "Second production method for the polymer compound of the present invention").

$R^{21}$ is preferably a group represented by —$C(R^{22})_3$ or a group represented by —$Si(R^{22})_3$, more preferably a group represented by —$C(R^{22})_3$, because the compound represented by the formula (2) is easily available.

$R^{22}$ is preferably an alkyl group, an aryl group or a monovalent heterocyclic group, more preferably an alkyl group or an aryl group, further preferably an alkyl group, because the compound represented by the formula (2) is easily available.

The compound represented by the formula (2) includes, for example, carbon-based compounds such as methyl iodide, propyl chloride, t-butyl chloride, hexyl bromide, benzyl chloride and triphenylmethane chloride; silicon-based compounds such as trimethylsilyl chloride, triethylsilyl chloride, tripropylsilyl chloride and triphenylsilyl chloride; and germanium-based compounds such as trimethylgermanium chloride and triphenylgermanium chloride.

The carbon-based compound is preferably propyl chloride, hexyl bromide, t-butyl chloride or triphenylmethane chloride, more preferably propyl chloride or t-butyl chloride.

The silicon-based compound is preferably trimethylsilyl chloride, triethylsilyl chloride or tripropylsilyl chloride, more preferably trimethylsilyl chloride or triethylsilyl chloride.

In the method for producing the polymer compound of the present invention, the condensation polymerization is preferably oxidation polymerization, Yamamoto polymerization, Suzuki polymerization or Stille polymerization, more preferably Yamamoto polymerization, Suzuki polymerization or Stille polymerization, further preferably Suzuki polymerization, because the luminance life of a light emitting device obtained by using the polymer compound of the present invention is more excellent.

As the group represented by —B(OR$^{C2}$)$_2$, groups represented by the following formulae are exemplified.

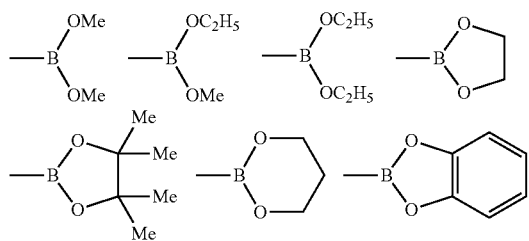

The compound having a group selected from Group A of substituents and the compound having a group selected from Group B of substituents undergo condensation polymerization by a known coupling reaction to give mutual bonding of carbon atoms linking the group selected from Group A of substituents and the group selected from Group B of substituents. Therefore, when a compound A having two groups selected from Group A of substituents and a compound B having two groups selected from Group B of substituents are subjected to a known coupling reaction, a condensed polymer of the compound A and the compound B can be obtained by condensation polymerization.

The condensation polymerization is carried out usually in the presence of a catalyst, a base and a solvent, and if necessary, a phase transfer catalyst may coexist.

The catalyst includes, for example, transition metal complexes such as palladium complexes such as dichlorobis(triphenylphosphine)palladium, dichlorobis(tris-o-methoxyphenylphosphine)palladium, dichlorobis(dicyclopentyl(o-methoxyphenyl)phosphinepalladium, palladium[tetrakis(triphenylphosphine)], [tris(dibenzylideneacetone)]dipalladium and palladium acetate, nickel complexes such as nickel[tetrakis(triphenylphosphine)], [1,3-bis(diphenylphosphino)propane]dichloronickel and [bis(1,4-cyclooctadiene)]nickel; these transition metal complexes further having a ligand such as triphenylphosphine, tri-o-tolylphosphine, tri-tert-butylphosphine, tricyclohexylphosphine, tris-o-methoxyphenylphosphine, dicyclopentyl(o-methoxyphenyl)phosphine, diphenylphosphinopropane and bipyridyl. The catalysts may be used singly or in combination.

The use amount of the catalyst is usually 0.00001 to 3 molar equivalents in terms of the amount of a transition metal with respect to the sum of the molar numbers of raw material monomers.

The base and the phase transfer catalyst include, for example, inorganic bases such as sodium carbonate, potassium carbonate, cesium carbonate, potassium fluoride, cesium fluoride and tripotassium phosphate; organic bases such as tetrabutylammonium fluoride, tetrabutylammonium hydroxide, tetraethylammonium hydroxide and tetramethylammonium hydroxide; and phase transfer catalysts such as tetrabutylammonium chloride and tetrabutylammonium bromide. The bases and the phase transfer catalysts each may be used singly or in combination.

The use amounts of the base and the phase transfer catalyst are each usually 0.001 to 100 molar equivalents with respect to the total molar number of raw material monomers.

The solvent includes, for example, organic solvents such as toluene, xylene, mesitylene, tetrahydrofuran, 1,4-dioxane, dimethoxyethane, N,N-dimethylacetamide and N,N-dimethylformamide; and water. The solvent may be used singly or two or more solvents may be used in combination.

The use amount of the solvent is usually 10 to 100000 parts by weight with respect to 100 parts by weight of the total amount of raw material monomers.

The reaction temperature of condensation polymerization is usually −100 to 200° C. The reaction time is usually 1 hour or longer.

The post treatment of the polymerization reaction is conducted by known methods, such as a method of removing water-soluble impurities by liquid separation and a method in which the reaction solution resulting from the polymerization reaction is added to a lower alcohol such as methanol and a precipitate deposited is collected by filtration and dried, that are applied individually or in combination. When the polymer compound has a low purity, the polymer host can be purified by a usual method, such as recrystallization, reprecipitation, continuous extraction by a Soxhlet extractor and column chromatography.

In the first production method for the polymer compound of the present invention, the content of the hydroxyl groups in the polymer compound may be further reduced by conducting an alumina treatment or a copper salt treatment after the step of condensation-polymerizing raw material monomers under the condition of an oxygen concentration of less than 0.5%.

In the second production method for the polymer compound of the present invention, the content of the hydroxyl groups in the polymer compound may be further reduced by conducting an alumina treatment or a copper salt treatment after the step of reacting with a compound represented by the formula (2).

The alumina treatment is a treatment in which a solution prepared by dissolving a polymer compound in a solvent is passed through alumina.

The solvent for dissolving a polymer compound includes, for example, organic solvents such as toluene, xylene, mesitylene, tetrahydrofuran, 1,4-dioxane, dimethoxyethane, N,N-dimethylacetamide and N,N-dimethylformamide; and water. The solvents may be used singly or in combination.

The alumina through which a solution prepared by dissolving a polymer compound in a solvent is passed through may be any of acidic alumina, basic alumina and neutral alumina. The aluminas may be used singly or in combination.

The center particle size of alumina is preferably 10000 μm or less, more preferably 5000 μm or less, further preferably 1 to 500 μm.

The amount of alumina is preferably 0.1 to 10000 parts by weight, more preferably 0.5 to 1000 parts by weight, further preferably 1 to 100 parts by weight with respect to 100 parts by weight of a polymer compound contained in a solvent.

The method for allowing a solution prepared by dissolving a polymer compound in a solvent to pass through alumina includes, for example, a method in which the solution and alumina are mixed, then, filtrated, and a method in which the solution is passed through alumina filled in a container. The number of times of passing a solution prepared by dissolving a polymer compound in a solvent through alumina may be one or two or more.

The temperature of the solution prepared by dissolving a polymer compound in a solvent in passing through alumina may be the freezing point or higher and the boiling point or lower of the solvent, and is preferably −10 to 200° C., more preferably −5 to 100° C., further preferably 0 to 60° C.

The copper salt treatment is a treatment in which a copper salt is added to a solution prepared by dissolving a polymer compound in a solvent and the mixture is stirred. A copper salt and additives may also be added. When a copper salt and additives are added, they may be added simultaneously to the solution, or a copper salt may be added before addition of additives.

The solvent for dissolving a polymer compound includes, for example, organic solvents such as toluene, xylene, mesitylene, tetrahydrofuran, 1,4-dioxane, dimethoxyethane, N,N-dimethylacetamide and N,N-dimethylformamide; and water. The solvents may be used singly or in combination.

The copper salt to be added to a solution prepared by dissolving a polymer compound in a solvent includes, for example, CuF, CuCl, CuBr, CuI, Cu(OTf), $Cu_2SO_4$, $CuNO_3$, $CuOCOCH_3$, $CuOCOCF_3$, CuOH, Cu(acac), $Cu_2OCuF_2$, $CuCl_2$, $CuBr_2$, $CuI_2$, $Cu(OTf)_2$, CuO, $CuSO_4$, $Cu(NO_3)_2$, $Cu(OCOCH_3)_2$, $Cu(OCOCF_3)_2$, $Cu(OH)_2$ and $Cu(acac)_2$, preferably CuCl, CuBr, CuI, $CuCl_2$, $CuBr_2$ or $CuI_2$, more preferably CuCl, CuBr or CuI. Here, "OTf" denotes a group represented by $-OSO_2CF_3$, and "acac" denotes a ligand represented by $CH_3COCH_2COCH_3$. The copper salts may be used singly or in combination.

The additives which may be added together with a copper salt to a solution prepared by dissolving a polymer compound in a solvent include, for example, pyridine, trimethylamine, tributylamine, diisopropylethylamine, dimethylbenzylamine, N,N,N',N'-tetramethylethylenediamine, N-ethyl-N,N',N'-trimethylethylenediamine, N-methyl-N,N', N'-trimethylethylenediamine, N,N,N',N'-tetramethyl-1,3-propanediamine, N,N,N',N'-tetraethylethylenediamine, 1,2-bis(N-methylpiperidino)ethane, N,N,N',N'-tetra-n-hexylethylenediamine, N,N,N',N'-tetra-amylethylenediamine, N,N,N',N'-tetramethyl-1,2-cyclohexanediamine, 2-(5-piperidinoethyl)pyridine, imidazole, pyrazole and diphenylmethaneamine, preferably pyridine, diisopropylethylamine, dimethylbenzylamine, N,N,N',N'-tetramethylethylenediamine, N,N,N',N'-tetramethyl-1,3-propanediamine, N,N,N',N'-tetraethylethylenediamine, 1,2-bis(N-methylpiperidino)ethane, N,N,N',N'-tetra-amylethylenediamine, N,N,N',N'-tetramethyl-1,2-cyclohexanediamine, 2-(5-piperidinoethyl)pyridine, imidazole or diphenylmethaneamine, more preferably N,N, N',N'-tetramethylethylenediamine, N,N,N',N'-tetramethyl-1,3-propanediamine, 1,2-bis(N-methylpiperidino)ethane, N,N,N',N'-tetramethyl-1,2-cyclohexanediamine, 2-(5-piperidinoethyl)pyridine or diphenylmethaneamine, further preferably N,N,N',N'-tetramethylethylenediamine, 2-(5-piperidinoethyl)pyridine or diphenylmethaneamine. The additives may be used singly or in combination.

In the copper salt treatment, after addition of a copper salt to a solution prepared by dissolving a polymer compound in a solvent, the solution may be heated at 200° C. or lower, and heating at 40° C. to 150° C. is preferable and heating at 50° C. to 100° C. is more preferable.

<Composition>

The composition of the present invention comprises at least one material selected from the group consisting of a hole transporting material, a hole injection material, an electron transporting material, an electron injection material, a light emitting material, an antioxidant and a solvent, and the polymer compound of the present invention.

The composition comprising the polymer compound of the present invention and a solvent (hereinafter, referred to as "ink" in some cases) is suitable for fabrication of a light emitting device using a printing method such as an inkjet print method and a nozzle print method.

The viscosity of the ink may be adjusted depending on the kind of the printing method, and when a solution goes through a discharge apparatus such as in an inkjet print method, the viscosity is preferably in the range of 1 to 20 mPa·s at 25° C. for preventing curved aviation and clogging in discharging.

As the solvent contained in the ink, those capable of dissolving or uniformly dispersing solid components in the ink are preferable. The solvent includes, for example, chlorine-based solvents such as 1,2-dichloroethane, 1,1,2-trichloroethane, chlorobenzene and o-dichlorobenzene; ether solvents such as tetrahydrofuran, dioxane, anisole and 4-methylanisole; aromatic hydrocarbon solvents such as toluene, xylene, mesitylene, ethylbenzene, n-hexylbenzene and cyclohexylbenzene; aliphatic hydrocarbon solvents such as cyclohexane, methylcyclohexane, n-pentane, n-hexane, n-heptane, n-octane, n-nonane, n-decane, n-decane and bicyclohexyl; ketone solvents such as acetone, methylethylketone, cyclohexanone, benzophenone and acetophenone; ester solvents such as ethyl acetate, butyl acetate, ethylcellosolve acetate, methyl benzoate and phenyl acetate; polyhydric alcohols such as ethylene glycol, glycerin and 1,2-hexanediol and derivatives thereof; alcohol solvents such as isopropanol and cyclohexanol; sulfoxide solvents such as dimethyl sulfoxide; and amide solvents such as N-methyl-2-pyrrolidone and N,N-dimethylformamide. These solvents may be used singly or two or more of them may be used in combination.

In the ink, the compounding amount of the above-described solvent is usually 1000 to 100000 parts by weight, preferably 2000 to 20000 parts by weight with respect to 100 parts by weight of the polymer compound of the present invention.

[Hole Transporting Material]

The hole transporting material is classified into low molecular weight compounds and polymer compounds, and polymer compounds are preferable, polymer compounds having a crosslink group are more preferable.

The polymer compound includes, for example, polyvinylcarbazole and derivatives thereof; polyarylene having an aromatic amine structure in the side chain or main chain and derivatives thereof. The polymer compound may also be a compound in which an electron accepting portion is linked. The electron accepting portion includes, for example, fullerene, tetrafluorotetracyanoquinodimethane, tetracyanoethylene, trinitrofluorenone and the like, preferably fullerene.

In the composition of the present invention, the compounding amount of the hole transporting material is usually 1 to 400 parts by weight, preferably 5 to 150 parts by weight with respect to 100 parts by weight of the polymer compound of the present invention.

The hole transporting material may be used singly or two or more hole transporting materials may be used in combination.

[Electron Transporting Material]

The electron transporting material is classified into low molecular weight compounds and polymer compounds. The electron transporting material may have a crosslink group.

The low molecular weight compound includes, for example, a metal complex having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene, diphenoquinone and derivatives thereof.

The polymer compound includes, for example, polyphenylene, polyfluorene and derivatives thereof. These polymer compounds may be doped with a metal.

In the composition of the present invention, the compounding amount of the electron transporting material is usually 1 to 400 parts by weight, preferably 5 to 150 parts by weight with respect to 100 parts by weight of the polymer compound of the present invention.

The electron transporting material may be used singly or two or more electron transporting materials may be used in combination.

[Hole Injection Material and Electron Injection Material]

The hole injection material and the electron injection material are each classified into low molecular weight compounds and polymer compounds. The hole injection material and the electron injection material may have a crosslink group.

The low molecular weight compound includes, for example, metal phthalocyanines such as copper phthalocyanine; carbon; oxides of metals such as molybdenum and tungsten; metal fluorides such as lithium fluoride, sodium fluoride, cesium fluoride and potassium fluoride.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as a polymer comprising a group represented by the formula (X) in the side chain or main chain.

In the composition of the present invention, the compounding amounts of the hole injection material and the electron injection material are each usually 1 to 400 parts by weight, preferably 5 to 150 parts by weight with respect to 100 parts by weight of the polymer compound of the present invention.

The hole injection material and the electron injection material may each be used singly or two or more of them may be used in combination.

[Ion Dope]

When the hole injection material or the electron injection material comprises an electrically conductive polymer, the electric conductivity of the electrically conductive polymer is preferably $1 \times 10^{-5}$ S/cm to $1 \times 10^{3}$ S/cm. For adjusting the electric conductivity of the electrically conductive polymer within such a range, the electrically conductive polymer can be doped with a suitable amount of ions.

The kind of the ion to be doped is an anion for a hole injection material and a cation for an electron injection material. The anion includes, for example, a polystyrenesulfonate ion, an alkylbenzenesulfonate ion and a camphorsulfonate ion. The cation includes, for example, a lithium ion, a sodium ion, a potassium ion and a tetrabutylammonium ion.

The ion to be doped may be used singly or two or more ions to be doped may be used.

[Light Emitting Material]

The light emitting material is classified into low molecular weight compounds and polymer compounds. The light emitting material may have a crosslink group.

The low molecular weight compound includes, for example, naphthalene and derivatives thereof, anthracene and derivatives thereof, perylene and derivatives thereof, and, triplet light emitting complexes having iridium, platinum or europium as the center metal.

The polymer compound includes, for example, polymer compounds comprising a phenylene group, a naphthalenediyl group, an anthracenediyl group, a pyrenediyl group, a fluorenediyldiyl group, a phenanthrenediyl group, a dihydrophenanthrenediyl group, a group represented by the formula (X), a carbazolediyl group, a phenoxazinediyl group, a phenothiazinediyl group and the like.

The light emitting material may comprise a compound of low molecular weight and a polymer compound, and preferably, comprises a triplet light emitting complex and a polymer compound.

As the triplet light emitting complex, iridium complexes represented by the formulae Ir-1 to Ir-3 are preferable.

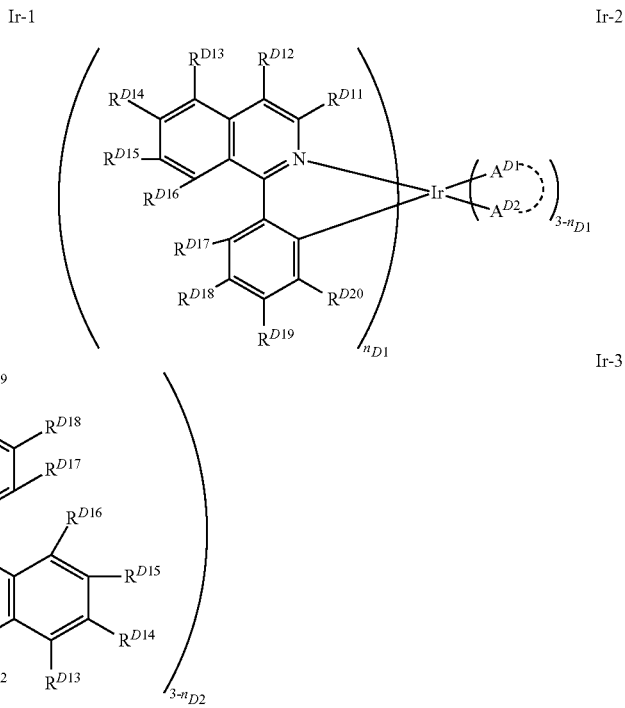

[wherein, $R^{D1}$ to $R^{D8}$ and $R^{D11}$ to $R^{D20}$ each independently represent a hydrogen atom, an alkyl group, an alkoxy group, an aryl group, an aryloxy group, a monovalent heterocyclic group or a halogen atom and these groups each optionally have a substituent.

-$A^{D1}$---$A^{D2}$- represents an anionic bidentate ligand, and $A^{D1}$ and $A^{D2}$ each independently represent a carbon atom, an oxygen atom or a nitrogen atom linking to an iridium atom.

$n_{D1}$ represents 1, 2 or 3, and $n_{D2}$ represents 1 or 2.].

In the triplet light emitting complex represented by the Ir-1, at least one of $R^{D1}$ to $R^{D8}$ is preferably a group represented by the formula (D-A).

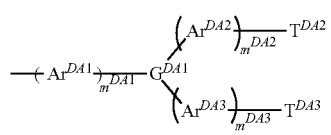

(D-A)

[wherein, $m^{DA1}$, $m^{DA2}$ and $m^{DA3}$ each independently represent an integer of 0 or more.

$G^{DA1}$ represents a nitrogen atom, an aromatic hydrocarbon group or a heterocyclic group and these groups each optionally have a substituent.

$Ar^{DA1}$, $Ar^{DA2}$ and $Ar^{DA3}$ each independently represent an arylene group or a divalent heterocyclic group and these groups each optionally have a substituent.

When there are a plurality of $Ar^{DA1}$ a plurality $Ar^{DA2}$ and a plurality of $Ar^{DA3}$, each of them may be the same or different.

$T^{DA2}$ and $T^{DA3}$ each independently represent an aryl group or a monovalent heterocyclic group and these groups each optionally have a substituent.].

$m^{DA1}$, $m^{DA2}$ and $m^{DA3}$ represent usually an integer of 10 or less, preferably an integer of 5 or less, more preferably 0 or 1. It is preferable that $m^{DA1}$, $m^{DA2}$ and $m^{DA3}$ are the same integer.

$G^{DA1}$ includes preferably groups represented by the formulae (GDA-11) to (GDA-15) and these groups each optionally have a substituent.

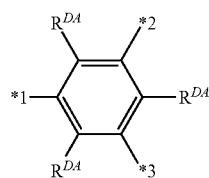

(GDA-11)

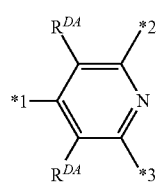

(GDA-12)

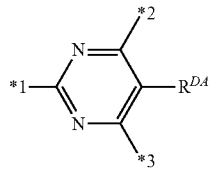

(GDA-13)

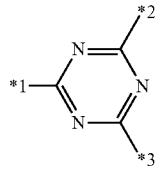

(GDA-14)

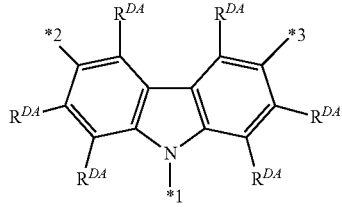

(GDA-15)

[wherein,

*1, *2 and *3 each represent a linkage to $Ar^{DA1}$, $Ar^{DA2}$ and $Ar^{DA3}$.

$R^{DA}$ represents a hydrogen atom, an alkyl group, an alkoxy group, an aryl group or a monovalent heterocyclic group and these groups optionally further have a substituent. When there are a plurality of $R^{DA}$, they may be the same or different.].

$R^{DA}$ is preferably a hydrogen atom, an alkyl group or an alkoxy group, more preferably a hydrogen atom or an alkyl group, and these groups each optionally have a substituent.

$Ar^{DA1}$, $Ar^{DA2}$ and $Ar^{DA3}$ are preferably groups represented by the formulae (ArDA-1) to (ArDA-3).

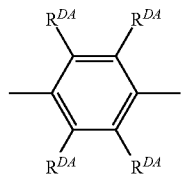

(ArDA-1)

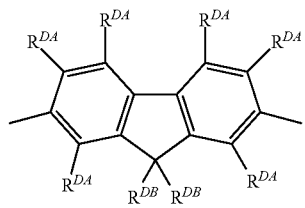

(ArDA-2)

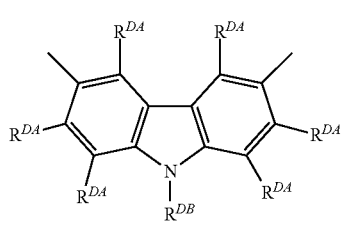

(ArDA-3)

[wherein, $R^{DA}$ represents the same meaning as described above.

$R^{DB}$ represents a hydrogen atom, an alkyl group, an aryl group or a monovalent heterocyclic group and these groups each optionally have a substituent. When there are a plurality of $R^{DB}$, they may be the same or different.].

$R^{DB}$ is preferably an alkyl group, an aryl group or a monovalent heterocyclic group, more preferably an aryl group or a monovalent heterocyclic group, further preferably an aryl group, and these groups each optionally have a substituent.

$T^{DA2}$ and $T^{DA3}$ are preferably groups represented by formulae (TDA-1) to (TDA-3).

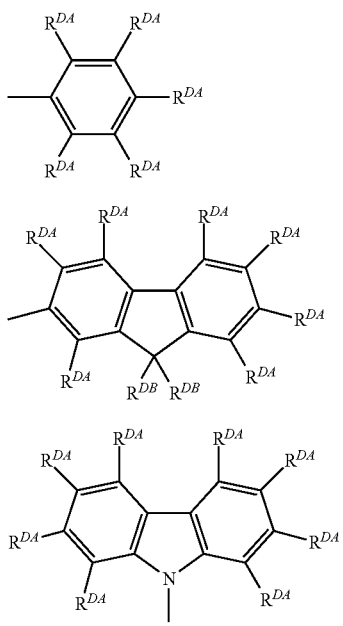

(TDA-1)

(TDA-2)

(TDA-3)

[wherein, $R^{DA}$ and $R^{DB}$ represent the same meaning as described above.].

In the formula Ir-2, at least one of $R^{D11}$ to $R^{D20}$ is preferably a group represented by the formula (D-A).

In the formula Ir-3, at least one of $R^{D1}$ to $R^{D8}$ and $R^{D11}$ to $R^{D20}$ is preferably a group represented by the formula (D-A).

The group represented by the formula (D-A) is preferably a group represented by the formulae (D-A1) to (D-A3).

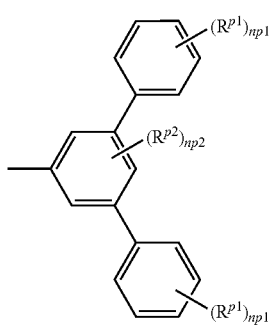

(D-A1)

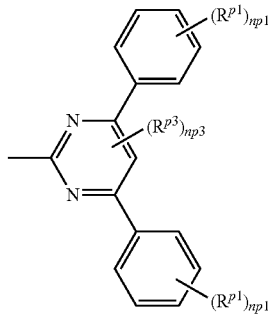

(D-A2)

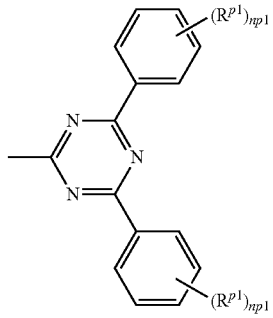

(D-A3)

[wherein, $R^{P1}$, $R^{P2}$ and $R^{P3}$ each independently represent an alkyl group, an alkoxy group or halogen atom. When there are a plurality of $R^{P1}$ and a plurality of $R^{P2}$, each of them may be the same or different.

np1 represents an integer of 0 to 5, np2 represents an integer of 0 to 3, and np3 represents 0 or 1. A plurality of np1 may be the same or different.].

np1 is preferably 0 or 1, more preferably 1. np2 is preferably 0 or 1, more preferably 0. np3 is preferably 0.

$R^{P1}$, $R^{P2}$ and $R^{P3}$ are preferably alkyl groups.

The anionic bidentate ligand represented by -$A^{D1}$---$A^{D2}$- includes, for example, ligands represented by the following formulae.

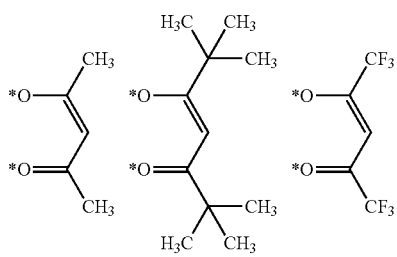

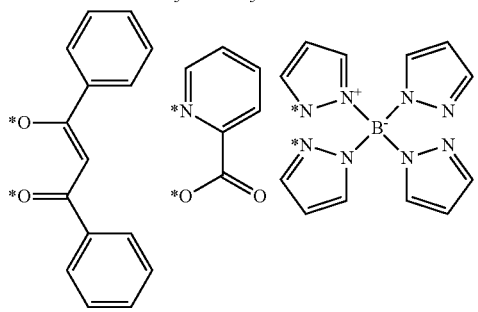

[wherein, * represents a position linking to Ir.].

The metal complex represented by the formula Ir-1 includes preferably metal complexes represented by the formulae Ir-11 to Ir-13. The metal complex represented by the formula Ir-2 is preferably a metal complex represented by the formula Ir-21. The metal complex represented by the formula Ir-3 includes preferably metal complexes represented by the formulae Ir-31 to Ir-33.

Ir-11

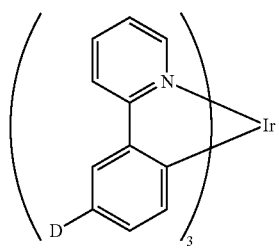

Ir-12

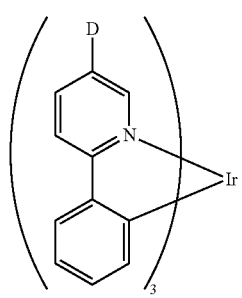

Ir-13

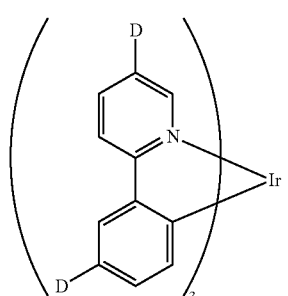

Ir-21

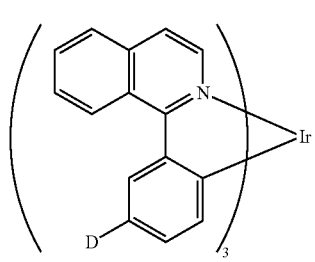

Ir-31

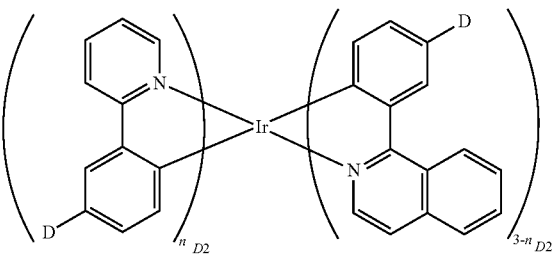

Ir-32

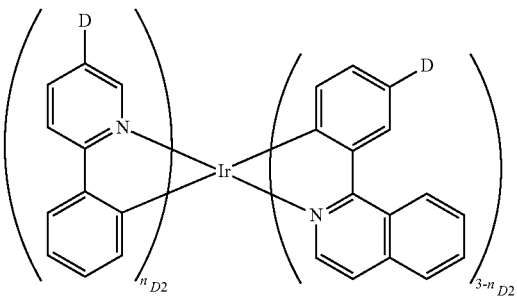

Ir-33

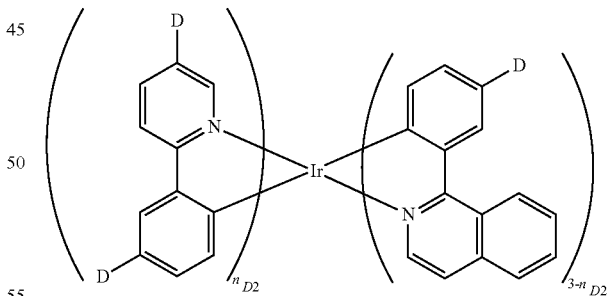

[wherein, D represents a group represented by the formula (D-A). $n_{D2}$ represents 1 or 2.].

The triplet light emitting complex includes, for example, metal complexes listed below.

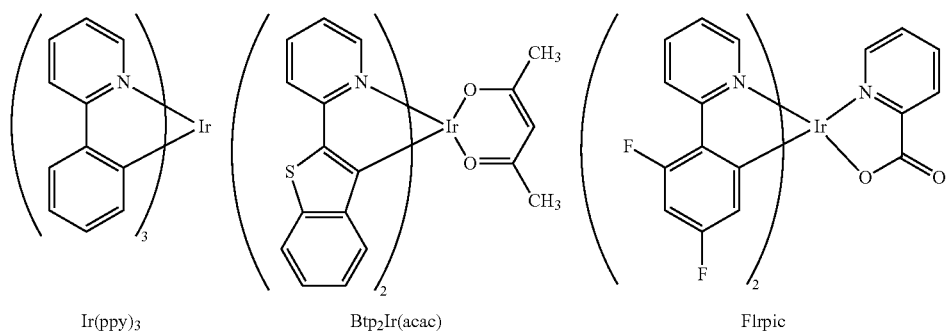
Ir(ppy)₃    Btp₂Ir(acac)    FIrpic
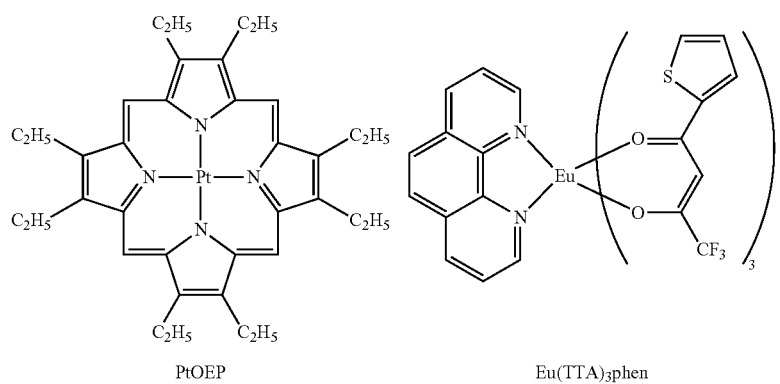
PtOEP    Eu(TTA)₃phen
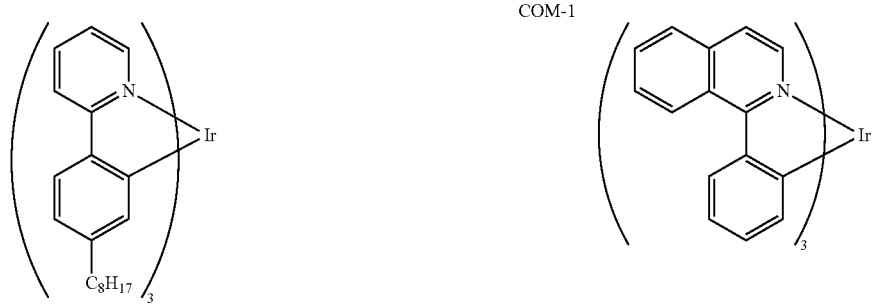
COM-1    COM-2
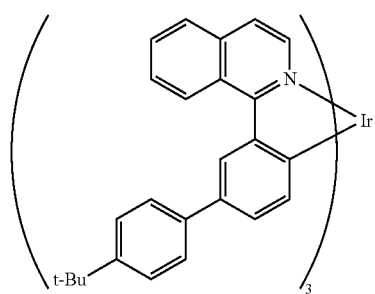
COM-3    COM-4
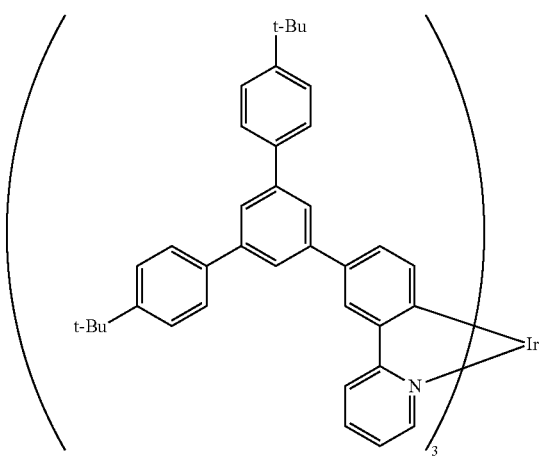

-continued
COM-5
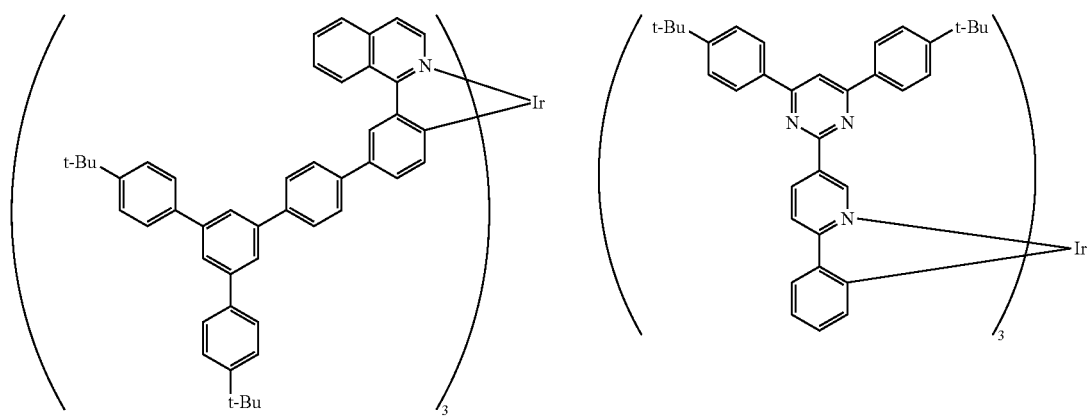
COM-6
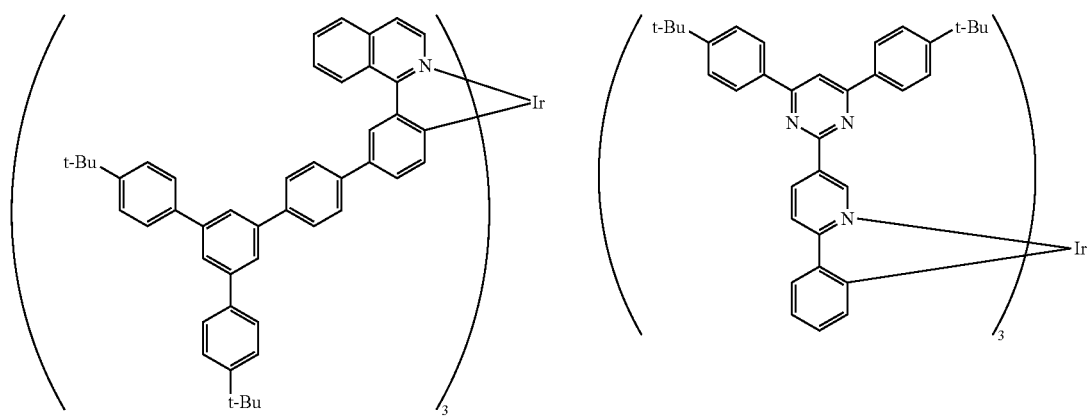
COM-7
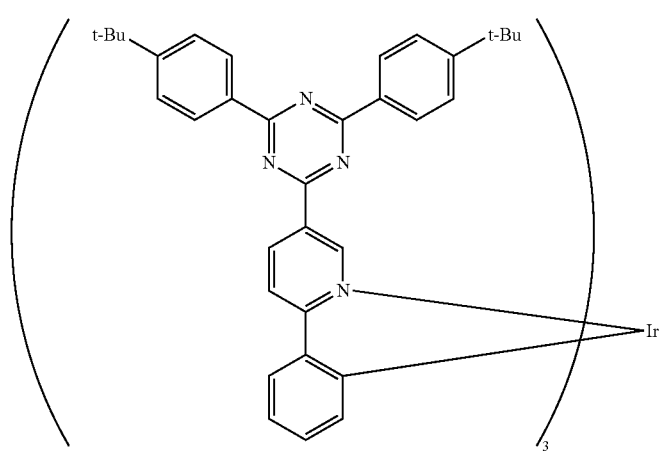
COM-8
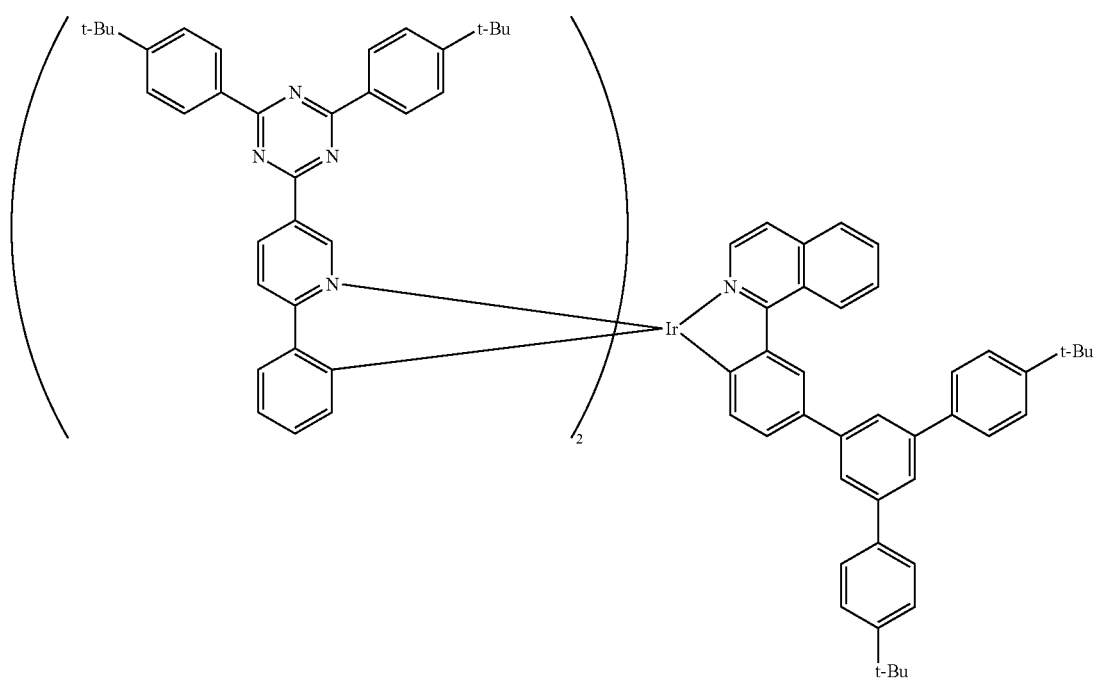

In the composition of the present invention, the compounding amount of the above-described light emitting material is usually 0.1 to 400 parts by weight with respect to 100 parts by weight of the polymer compound of the present invention.

[Antioxidant]

The antioxidant may advantageously be one which is soluble in the same solvent as for the polymer compound of the present invention and does not disturb light emission and charge transportation, and the examples thereof include phenol antioxidants and phosphorus-based antioxidants.

In the composition of the present invention, the compounding amount of the antioxidant is usually 0.001 to 10 parts by weight with respect to 100 parts by weight of the polymer compound of the present invention.

The antioxidant may be used singly or two or more antioxidants may be used in combination.

<Film>

The film comprises the polymer compound of the present invention.

The film includes also an insolubilized film obtained by insolubilizing the polymer compound of the present invention in a solvent by cross-linkage. The insolubilized film is a film obtained by crosslinking the polymer compound of the present invention by external stimulation such as heat and light irradiation. The insolubilized film can be suitably used for lamination of a light emitting device because the film is substantially insoluble in a solvent.

The heating temperature for crosslinking the film is usually 25 to 300° C., and because the light emission efficiency is improved, preferably 50 to 250° C., more preferably 150 to 200° C.

The kind of light used in light irradiation for crosslinking the film includes, for example, ultraviolet light, near-ultraviolet light and visible light.

The film is suitable as a hole transporting layer or a light emitting layer in a light emitting device.

The film can be fabricated, for example, by a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method or a nozzle coat method, using the ink.

The thickness of the film is usually 1 nm to 10 μm.

<Light Emitting Device>

The light emitting device of the present invention is a light emitting device comprising an anode, a cathode and a light emitting layer disposed between the anode and the cathode in which the light emitting layer is a layer obtained by using the polymer compound of the present invention, and the light emitting device includes, for example, light emitting devices comprising the polymer compound of the present invention, and light emitting devices in which the polymer compounds of the present invention are cross-linked intramolecularly, intermolecularly or in both modes.

[Layer Constitution]

In addition to the light emitting layer, a hole transporting layer, a hole injection layer, an electron transporting layer and an electron injection layer may be a layer obtained by using the polymer compound of the present invention, and it is preferable that the hole transporting layer is a layer obtained by using the polymer compound of the present invention, because the luminance life of a light emitting device using the polymer compound of the present invention is more excellent. These layers comprise a hole transporting material, a hole injection material, an electron transporting material and an electron injection material, respectively. These layers can be formed by dissolving a hole transporting material, a hole injection material, an electron transporting material and an electron injection material in the solvent described above to prepare inks, respectively, and applying the inks using the same method as the above-described film fabrication.

The light emitting device of the present invention preferably comprises at least one of a hole injection layer and a hole transporting layer between an anode and a light emitting layer from the standpoint of hole injectability and hole transportability, and preferably comprises at least one of an electron injection layer and an electron transporting layer between a cathode and a light emitting layer from the standpoint of electron injectability and electron transportability.

The material of a hole transporting layer, an electron transporting layer, a light emitting layer, a hole injection layer and an electron injection layer includes the above-described hole transporting materials, electron transporting materials, light emitting materials, hole injection materials and electron injection materials, respectively, in addition to the polymer compound of the present invention.

When the material of a hole transporting layer, the material of an electron transporting layer and the material of a light emitting layer are soluble in a solvent which is used in forming a layer adjacent to the hole transporting layer, the electron transporting layer and the light emitting layer, respectively, in fabrication of a light emitting device, it is preferable that the materials have a crosslink group to avoid dissolution of the materials in the solvent. After forming the layers using the materials having a crosslink group, the layers can be insolubilized by crosslinking the crosslink group.

Methods of forming respective layers such as a light emitting layer, a hole transporting layer, an electron transporting layer, a hole injection layer and an electron injection layer in the light emitting device of the present invention include, for example, a method of vacuum vapor deposition from a powder and a method of film formation from solution or melted state when a low molecular weight compound is used, and, for example, a method of film formation from solution or melted state when a polymer compound is used.

The order and the number of layers to be laminated and the thickness of each layer may be controlled in view of light emission efficiency and device life.

[Substrate/Electrode]

The substrate in the light emitting device may advantageously be a substrate on which an electrode can be formed and which does not chemically change in forming an organic layer, and is a substrate made of a material such as, for example, glass, plastic and silicon. In the case of an opaque substrate, it is preferable that an electrode most remote from the substrate is transparent or semi-transparent.

The material of the anode includes, for example, electrically conductive metal oxides and semi-transparent metals, preferably, indium oxide, zinc oxide and tin oxide; electrically conductive compounds such as indium.tin.oxide (ITO) and indium.zinc.oxide; a composite of silver, palladium and copper (APC); NESA, gold, platinum, silver and copper.

The material of the cathode includes, for example, metals such as lithium, sodium, potassium, rubidium, cesium, beryllium, magnesium, calcium, strontium, barium, aluminum, zinc and indium; alloys composed of two or more of them; alloys composed of one or more of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

The anode and the cathode may each take a lamination structure composed of two or more layers.

[Use]

For obtaining planar light emission using a light emitting device, it may be advantageous that a planar anode and a planar cathode are disposed so as to overlap. For obtaining light emission in the form of pattern, there are a method in which a mask having a window in the form of pattern is placed on the surface of a planer light emitting device, a method in which a layer intending a non-luminous part is formed extremely thickly to give substantially no emission, and a method in which an anode or a cathode or both electrodes are formed in the form of pattern. By forming a pattern by any of these methods and by disposing several electrodes so that independent ON/OFF is possible, a segment type display capable of displaying numbers and letters, simple marks and the like is obtained. For obtaining a dot matrix display, it may be advantageous that both an anode and a cathode are formed in the form of stripe and disposed so as to cross. Partial color display and multi-color display are made possible by a method in which several kinds of polymer compounds showing different emission colors are painted separately and a method of using a color filter or a fluorescence conversion filter. The dot matrix display can be passively driven, or actively driven combined with TFT and the like. These displays can be used in computers, television sets, portable terminals, cellular telephones, car navigations, video camera view finders and the like. The planar light emitting device is of self-emission and thin type, and can be suitably used as a planer light source for backlight of a liquid display, or as a planar light source for illumination. If a flexible substrate is used, it can be used also as a curved light source and a curved display.

EXAMPLES

Examples will be shown below for illustrating the present invention further in detail, but the present invention is not limited to them.

In the present examples, compounds shown in Tables 2 and 3 were used as raw material monomers for synthesis of polymer compounds. The compounds were synthesized according to methods described in reference documents shown in Tables 2 and 3 and Synthesis Example 1.

TABLE 2

| Compound | Structural formula | Reference document |
|---|---|---|
| Q-1 | | U.S. Pat. No. 6,169,163 |
| Q-2 | | U.S. Pat. No. 6,169,163 |
| Q-3 | | JP-A No. 2011-174062 |
| Q-4 | | JP-A No. 2010-189630 |

TABLE 2-continued

| Compound | Structural formula | Reference document |
| --- | --- | --- |
| Q-5 | ![2,7-dibromo-9,9-dioctylfluorene] | WO2002/045184 |
| Q-6 | ![2,7-dibromo-9,9-bis(4-hexylphenyl)fluorene] | JP-A No. 2011-174061 |

TABLE 3

| Compound | Structural formula | Reference document, Synthesis Example |
| --- | --- | --- |
| Q-7 | ![2,7-dibromo-9,9-bis(3-hexylphenyl)fluorene] | JP-A No. 2011-174061 |
| Q-8 | ![2,7-dibromo-9,9-bis(bicyclobutylphenyl)fluorene] | JP-A No. 2008-106241 |
| Q-9 | ![N,N'-bis(4-bromophenyl)-N,N'-bis(2,6-dimethyl-4-tert-butylphenyl)-p-phenylenediamine] | JP-A No. 2004-143419 |

TABLE 3-continued
| Compound | Structural formula | Reference document, Synthesis Example |
|---|---|---|
| Q-10 | 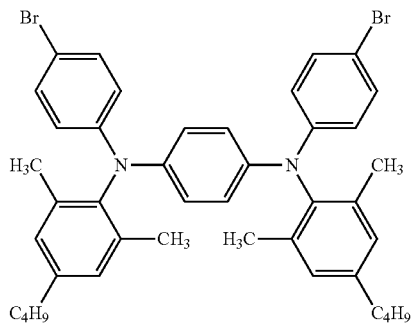 | Synthesis Example 1 |
| Q-11 | 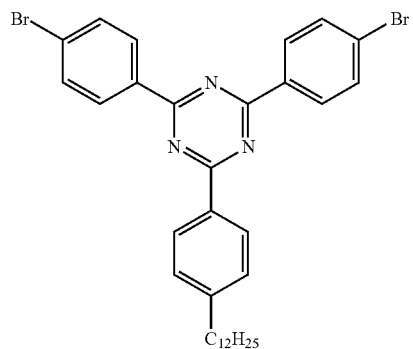 | JP-A No. 2012-036388 |
<Synthesis Example 1> Synthesis of Q-10
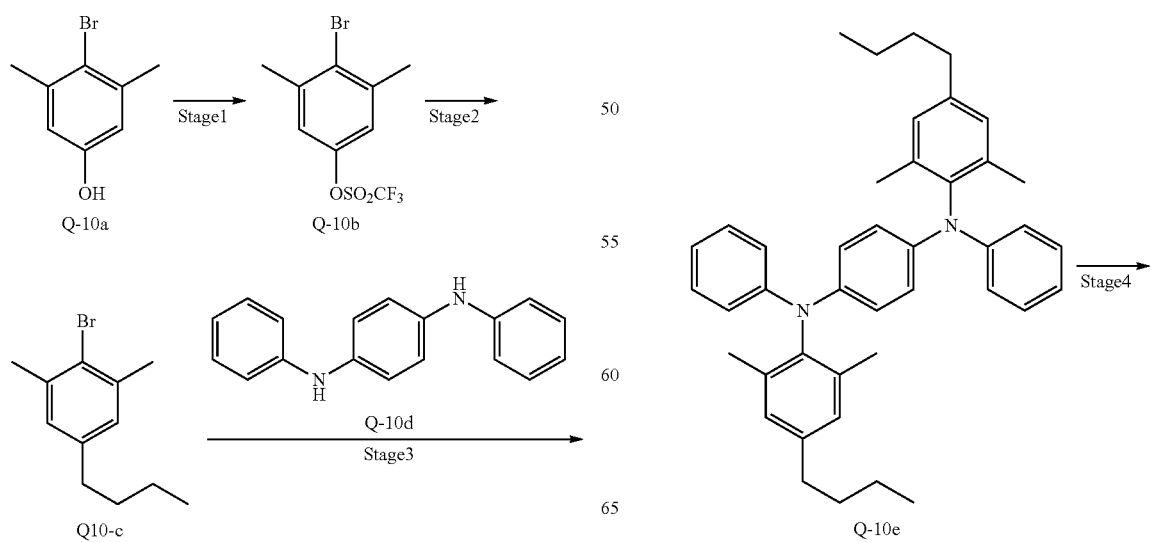

-continued

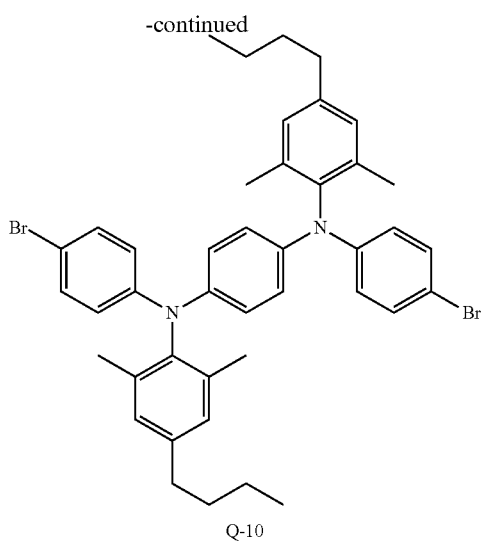

Q-10

(Stage 1: Synthesis of Compound Q-10b)

A nitrogen gas atmosphere was prepared in a reaction vessel, then, a compound Q-10a (117.6 g), N,N-dimethylaminopyridine (107.2 g) and dichloromethane (1170 mL) were added and the mixture was stirred. The resultant solution was cooled by an ice bath, then, trifluoromethanesulfonic anhydride (198.0 g) was dropped over a period of 1 hour. Thereafter, the ice bath was removed, and the mixture was stirred for 1.5 hours. Thereafter, the resultant solution was cooled again by an ice bath, then, a saturated ammonium chloride aqueous solution was added, and the solution was separated to obtain an organic layer (organic layer 1) and an aqueous layer. To the resultant aqueous layer was added hexane and extraction was performed to obtain an organic layer, and this organic layer and the organic layer 1 were combined, and washed with ion exchanged water and saturated saline, sequentially. The resultant organic layer was purified by a silica gel short column, then, concentrated under reduced pressure, to obtain a brown liquid (200 g) containing a compound Q-10b.

(Stage 2: Synthesis of Compound Q-10c)

A nitrogen gas atmosphere was prepared in a reaction vessel, then, the brown liquid (100 g) containing the compound Q-10b, [1,1'-bis(diphenylphosphino)ferrocene]palladium(II) dichloride dichloromethane adduct (PdCl$_2$ (dppf) .CH$_2$Cl$_2$, 1.2 g) and tetrahydrofuran (1000 mL) were added. Thereafter, the mixture was heated up to 55° C. while stirring. Into this, a 2 mol/L n-butylmagnesium chloride tetrahydrofuran solution (41.3 g) was dropped at 55° C., then, the mixture was stirred at 55° C. for 3.5 hours. Thereafter, the mixture was cooled down to room temperature, and a saturated ammonium chloride aqueous solution was added. The resultant organic layer was washed with ion exchanged water and saturated saline, sequentially. Thereafter, the organic layer was dried over anhydrous magnesium sulfate, filtrated, and the resultant filtrate was concentrated under reduced pressure, to obtain an oily substance. The resultant oily substance was purified by distillation under reduced pressure, to obtain a compound Q-10c as a colorless liquid (20 g). The yield was 30%. The GC (gas chromatography) area percentage value of the resultant compound Q-10c was 98%. This operation was repeated, to obtain a necessary amount of the compound Q-10c.

(Stage 3: Synthesis of Compound Q-10e)

A nitrogen gas atmosphere was prepared in a reaction vessel, then, a compound Q-10c (97.3 g), a compound Q-10d (50.0 g), toluene (1.5 L), tris(dibenzylideneacetone)dipalladium(0) (2.64 g), tri-tert-butylphosphine tetrafluoroborate salt (1.67 g) and sodium tert-butoxide (55.4 g) were added, and the mixture was stirred for 20 hours under reflux with heating. Thereafter, the mixture was cooled down to room temperature, and ion exchanged water was added. The resultant organic layer was washed with ion exchanged water and saturated saline, sequentially, and the resultant organic layer was dried over anhydrous magnesium sulfate, filtrated, and the resultant filtrate was concentrated under reduced pressure, to obtain a solid. The resultant solid was dissolved in toluene, then, purified by a silica gel short column (toluene), silica gel column chromatography (toluene/hexane) and recrystallization (toluene/acetonitrile), sequentially, and dried at 50° C. overnight under reduced pressure, to obtain a compound Q-10e (85.6 g) as a white solid. The yield was 77%. The HPLC (high performance liquid chromatography) area percentage value of the compound Q-10e was 99.5%.

(Stage 4: Synthesis of Compound Q-10)

A nitrogen gas atmosphere was prepared in a light-shielded reaction vessel, then, the compound Q-10e (45 g) and dichloromethane (750 mL) were added. The resultant solution was cooled down to 5° C. or lower by an ice bath, then, N-bromosuccinimide (28.3 g) was added in divided doses at a temperature of 5° C. or lower. Thereafter, the ice bath was removed, and the mixture was stirred overnight. The resultant reaction liquid was diluted with dichloromethane, then, washed with a 10 wt % sodium carbonate aqueous solution, saturated saline and ion exchanged water, sequentially, and passed through a silica gel short column (dichloromethane), then, concentrated under reduced pressure, to obtain a solid. The resultant solid was purified several times by recrystallization (toluene/isopropanol), to obtain a compound Q-10 (19.9 g) as a white solid. The yield was 35%. The HPLC area percentage value of the compound Q-10 was 99.5% or more.

$^1$H-NMR (THF-d$_8$, 300 MHz): δ (ppm)=7.23 (d, 4H), 6.95 (s, 4H), 6.88 (s, 4H), 6.75 (d, 4H), 2.56 (t, 4H), 1.99 (s, 12H), 1.66-1.55 (m, 4H), 1.44-1.32 (m, 4H), 0.94 (t, 6H).

<Example 1> Synthesis of Polymer Compound P-1

An inert gas atmosphere was prepared in a reaction vessel, then, a compound Q-1 (3.64 mmol), a compound Q-2 (8.46 mmol), a compound Q-7 (8.46 mmol), a compound Q-9 (1.95 mmol), a compound Q-11 (2.61 mmol), dichlorobis(tris(2-methoxyphenyl)phosphine(palladium) (3.4 mg) and toluene (280 ml) were added. Thereafter, the oxygen concentration in the reaction vessel was adjusted to less than 0.01% by volume, and the mixture was heated at 86° C. Thereafter, to this was added a 20 wt % tetraethylammonium hydroxide aqueous solution (43 mL), and the mixture was stirred for 6 hours. Thereafter, to this was added phenylboronic acid (158 mg), and the mixture was further stirred for 22 hours.

Thereafter, the mixture was cooled down to room temperature, the resultant reaction liquid was diluted with toluene (1100 ml), and washed with ion exchanged water (60 ml)). The resultant toluene solution was washed with 10% hydrochloric acid (60 ml), 3 wt % ammonia water (60 ml) and ion exchanged water (60 ml) in this order each twice, and purified by passing through an alumina column and a silica gel column.

The resultant toluene solution was dropped into methanol (11 L), and the mixture was stirred for 1 hour, then, the resultant solid was isolated by filtration and dried, to obtain 11.2 g of a polymer compound P-1.

The polymer compound P-1 had a polystyrene equivalent number-average molecular weight (hereinafter, referred to as "Mn") of $5.1 \times 10^4$ and a polystyrene equivalent weight-average molecular weight (hereinafter, referred to as "Mw") of $1.4 \times 10^5$.

The oxygen concentration was measured by using a residual oxygen meter (manufactured by Iijima Electronics Corporation, Pack Master RO-103), and Mn and Mw were measured by using a high performance GPC (gel permeation chromatography) apparatus (manufactured by Tosoh Corporation, HLC-8320GPC).

The synthesis conditions and the like of the polymer compound P-1 are shown in Table 4.

<Examples 2 to 5 and Comparative Examples 1 to 5> Synthesis of Polymer Compounds P-2 to P-5 and Polymer Compounds C-1 to C-5

Polymer compounds P-2 to P-5 and polymer compounds C-1 to C-5 were synthesized in the same method as for synthesis of the polymer compound P-1, using compounds, catalysts, bases and phase transfer catalysts shown in Tables 4 and 5 at oxygen concentrations (volume base) shown in Tables 4 and 5.

TABLE 4

| Polymer compound | Compound | Catalyst | Base/phase transfer catalyst | Molecular weight | Oxygen concentration |
|---|---|---|---|---|---|
| Example 1 P-1 | Q-1 (3.64 mmol) Q-2 (8.46 mmol) Q-7 (8.46 mmol) Q-9 (1.95 mmol) Q-11 (2.61 mmol) | cat 1 (3.4 mg) | TEAH (43 ml) | $3.5 \times 10^4$ (Mn) $1.1 \times 10^5$ (Mw) | less than 0.01% |
| Example 2 P-2 | Q-1 (1.99 mmol) Q-2 (4.85 mmol) Q-7 (4.64 mmol) Q-9 (1.07 mmol) Q-11 (1.43 mmol) | cat 2 (0.5 mg) | TMAH (123 ml)/ TBAB (0.14 g) | $3.0 \times 10^4$ (Mn) $1.0 \times 10^5$ (Mw) | less than 0.05% |
| Example 3 P-3 | Q-4 (16.5 mmol) Q-6 (13.6 mmol) Q-11 (3.43 mmol) | cat 1 (4.5 mg) | TEAH (57 ml) | $3.9 \times 10^4$ (Mn) $1.1 \times 10^5$ (Mw) | less than 0.2% |
| Example 4 P-4 | Q-3 (10.5 mmol) Q-5 (2.77 mmol) Q-8 (1.63 mmol) Q-10 (6.47 mmol) | cat 1 (2.6 mg) | TEAH (51 ml) | $4.4 \times 10^4$ (Mn) $1.4 \times 10^5$ (Mw) | less than 0.05% |
| Example 5 P-5 | Q-2 (13.27 mmol) Q-5 (12.08 mmol) Q-9 (1.34 mmol) | cat 1 (3.5 mg) | TEAH (44 ml) | $8.0 \times 10^4$ (Mn) $3.0 \times 10^5$ (Mw) | less than 0.01% |

TABLE 5

| Polymer compound | Compound | Catalyst | Base/phase transfer catalyst | Molecular weight | Oxygen concentration |
|---|---|---|---|---|---|
| Comparative Example 1 C1 | Q-1 (3.64 mmol) Q-2 (8.58 mmol) Q-7 (8.46 mmol) Q-9 (1.95 mmol) Q-11 (2.60 mmol) | cat 1 (3.4 mg) | TEAH (43 ml) | $4.0 \times 10^4$ (Mn) $1.0 \times 10^5$ (Mw) | 10% or more |
| Comparative Example 2 C-2 | Q-1 (3.64 mmol) Q-2 (8.46 mmol) Q-7 (8.46 mmol) Q-9 (1.95 mmol) Q-11 (2.61 mmol) | cat 2 (2.8 mg) | TEAH (216 ml) | $3.0 \times 10^4$ (Mn) $1.0 \times 10^5$ (Mw) | 5% or more |
| Comparative Example 3 C-3 | Q-4 (16.5 mmol) Q-6 (13.6 mmol) Q-11 (3.43 mmol) | cat 1 (4.5 mg) | TEAH (57 ml) | $5.0 \times 10^4$ (Mn) $1.3 \times 10^5$ (Mw) | 1% or more |
| Comparative Example 4 C-4 | Q-3 (10.5 mmol) Q-5 (2.77 mmol) Q-8 (1.63 mmol) Q-10 (6.47 mmol) | cat 1 (2.6 mg) | TEAH (51 ml) | $4.6 \times 10^4$ (Mn) $1.4 \times 10^5$ (Mw) | 10% or more |
| Comparative Example 5 C-5 | Q-2 (13.27 mmol) Q-5 (12.08 mmol) Q-9 (1.34 mmol) | cat 1 (3.5 mg) | TEAH (44 ml) | $8.0 \times 10^4$ (Mn) $3.0 \times 10^5$ (Mw) | 1% or more | cat1, cat2, TEAH, TMAH and TBAB in Tables 4 and 5 denote the following compounds, respectively.

cat 1: dichlorobis(tris(2-methoxyphenyl)phosphine)palladium cat 2: dichlorobis(dicyclopentyl(2-methoxyphenylphosphine)palladium TEAH: 20 wt % tetraethylammonium hydroxide aqueous solution TMAH: 14 wt % tetramethylammonium hydroxide aqueous solution TBAB: tetrabutylammonium bromide <Example 6> Synthesis of Polymer Compound P-6

For protecting a hydroxyl group contained in the polymer compound C-1, trimethylsilylation (TMS) of a hydroxyl group was performed.

An inert gas atmosphere was prepared in a reaction vessel, then, the polymer compound C-1 (1.0 g) and toluene (125 ml) were added. To the resultant toluene solution were added imidazole (0.3 g), N,N-dimethylformamide (3.0 g) and trimethylsilyl chloride (0.3 g), and the mixture was stirred at room temperature for 4 hours. To the resultant reaction liquid was added ion exchanged water (10 ml), then, the solution was separated and washed. The resultant organic layer was dropped into methanol (700 ml), the mixture was stirred for 1 hour, then, the solid was isolated by filtration and dried, to obtain 0.8 g of a polymer compound P-6.

The polymer compound P-6 had an Mn of $4.0 \times 10^4$ and an Mw of $1.0 \times 10^5$. Mn and Mw were measured by using a high performance GPC apparatus (manufactured by Tosoh Corporation, HLC-8320GPC).

The molecular weights of the polymer compound P-6 and the polymer compound used in the reaction are shown in Table 6.

<Examples 7 to 9> Synthesis of Polymer Compounds P-7, P-8 and P-9

Polymer compounds P-7, P-8 and P-9 were synthesized in the same method as for synthesis of the polymer compound P-6. The molecular weights of the polymer compounds P-7, P-8 and P-9 and the polymer compounds used in the reaction are shown in Table 6.

TABLE 6

| | Polymer compound | Polymer compound used in reaction | Molecular weight |
|---|---|---|---|
| Example 6 | P-6 | C-1 (1.0 g) | $4.0 \times 10^4$ (Mn) |
| | | | $1.0 \times 10^5$ (Mw) |
| Example 7 | P-7 | C-3 (1.0 g) | $5.0 \times 10^4$ (Mn) |
| | | | $1.3 \times 10^5$ (Mw) |
| Example 8 | P-8 | C-4 (1.0 g) | $4.6 \times 10^4$ (Mn) |
| | | | $1.4 \times 10^5$ (Mw) |
| Example 9 | P-9 | C-5 (1.0 g) | $8.0 \times 10^4$ (Mn) |
| | | | $3.0 \times 10^5$ (Mw) |

<Measurement> Measurement of Content of Hydroxyl Groups Contained in Polymer Compound The polymer compounds (20 mg) synthesized above were dissolved in THF-$d_8$ (0.75 ml) and subjected to proton NMR measurement, to determine the amount of hydroxyl groups in the polymer compounds. For NMR measurement, a nuclear magnetic resonance apparatus (manufactured by BRUKER, AV-600) was used.

For the polymer compounds P-1, P-2, P-4, P-5, P-6, P-7, P-8, P-9, C-1, C-2, C-4 and C-5, the content of the hydroxyl groups was measured by directly measuring a proton of a hydroxyl group. Specifically, a constitutional unit having a hydroxyl group generated during synthesis of the polymer compound was identified as the following constitutional unit and its content was quantified by the spectrum of proton NMR and the structures of raw material monomers used for synthesis of the polymer compound. The measurement results are shown in Table 7.

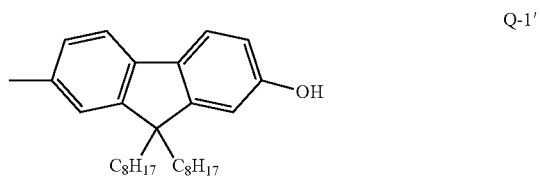

Q-1'

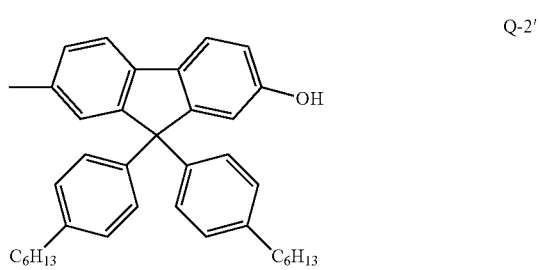

Q-2'

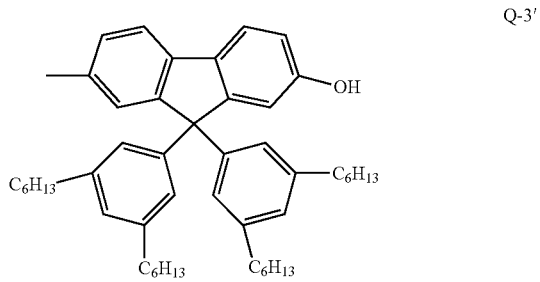

Q-3'

For the polymer compounds P-3, P-7 and C-3, a proton of a hydroxyl group could not be measured directly, therefore, a constitutional unit having a hydroxyl group was guessed as the following constitutional unit, and a constitutional unit having a hydroxyl group generated during synthesis of the polymer compound was identified as the following constitutional unit and its content was quantified by the spectrum of proton NMR having measured the peak of a proton linked to a carbon atom on the ortho position to a carbon atom to which a hydroxyl group is linked. The measurement results are shown in Table 7.

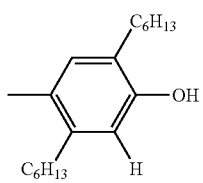

Q-4'

TABLE 7

| Polymer compound | Content of hydroxyl groups (mol %) | Chemical shift value (ppm) |
|---|---|---|
| P-1 | less than 0.01 | 8.33, 8.25, 8.23, 8.21 |
| P-2 | less than 0.01 | 8.33, 8.25, 8.23, 8.21 |
| P-3 | less than 0.01 | 6.59 |
| P-4 | less than 0.01 | 8.34, 8.28 |
| P-5 | less than 0.01 | 8.27 |
| P-6 | less than 0.01 | 8.33, 8.25, 8.23, 8.21 |

TABLE 7-continued

| Polymer compound | Content of hydroxyl groups (mol %) | Chemical shift value (ppm) |
|---|---|---|
| P-7 | less than 0.01 | 6.59 |
| P-8 | less than 0.01 | 8.34, 8.28 |
| P-9 | less than 0.01 | 8.27 |
| C-1 | 0.20 | 8.33, 8.25, 8.23, 8.21 |
| C-2 | 0.03 | 8.33, 8.25, 8.23, 8.21 |
| C-3 | 0.02 | 6.59 |
| C-4 | 0.06 | 8.34, 8.28 |
| C-5 | 0.02 | 8.27 |

<Measurement>

The polymer compounds P-1, P-2, P-3 and P-4 were subjected to elemental analysis, to determine the contents of a chlorine atom, a bromine atom, a palladium atom and a phosphorus atom in the polymer compounds. The measurement results are shown in Table 8.

TABLE 8

| Polymer compound | Cl (ppm) | Br (ppm) | Pd (ppm) | P (ppm) |
|---|---|---|---|---|
| P-1 | less than 5 | less than 5 | less than 10 | less than 10 |
| P-2 | less than 5 | less than 5 | less than 50 | less than 50 |
| P-3 | unmeasured | less than 5 | less than 10 | less than 50 |
| P-4 | unmeasured | less than 5 | less than 50 | less than 10 |

<Synthesis Example 1> Synthesis of Metal Complex 1

The metal complex 1 was synthesized according to a synthesis method described in JP-A No. 2012-36388.

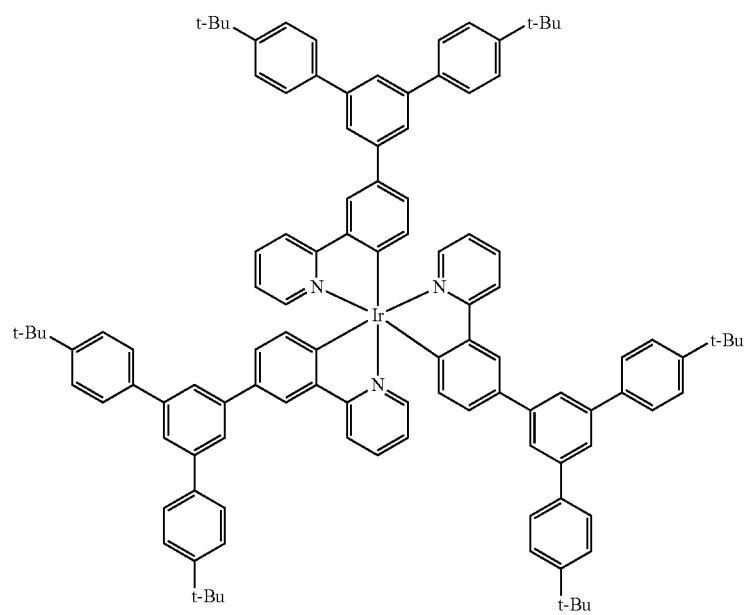

Metal complex 1

<Synthesis Example 2> Synthesis of Metal Complex 2

The metal complex 2 was synthesized according to a synthesis method described in WO2006/062226.

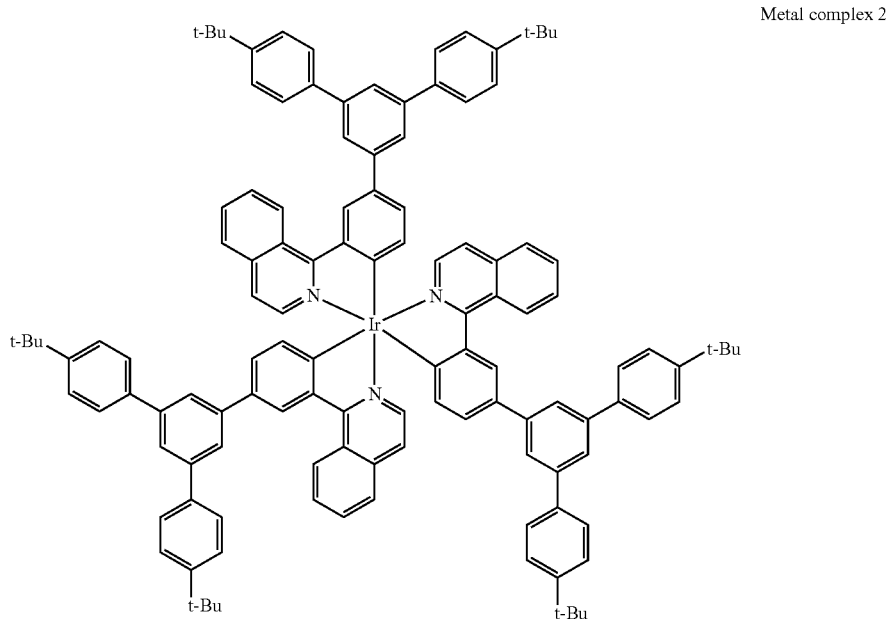

Metal complex 2

Example D1: Fabrication and Evaluation of Light Emitting Device D1

On a glass substrate carrying thereon an ITO film with a thickness of 45 nm formed by a sputtering method, a mixed solution of ethylene glycol monobutyl ether of polythiophenesulfonic acid/water=3/2 (volume ratio) (manufactured by Sigma Aldrich, trade name: Plexcore OC 1200) was spin-coated to form a film with a thickness of 50 nm, which was then dried on a hot plate at 170° C. for 15 minutes to form a hole injection layer.

Next, the polymer compound P-4 was dissolved in xylene to prepare a 0.7 wt % xylene solution. This xylene solution was spin-coated on the above-described glass substrate having the hole injection layer formed thereon, to form an organic film of the polymer compound P-4 with a thickness of 20 nm. This was heated on a hot plate at 190° C. for 60 minutes, in a nitrogen gas atmosphere having an oxygen concentration and a moisture concentration both of which were 10 ppm or less (volume base), to form a hole transporting layer as an insolubilized organic film.

Next, the polymer compound P-1 was dissolved in xylene, to prepare a 1.5 wt % xylene solution. This xylene solution was spin-coated on the above-described glass substrate having the hole transporting layer formed thereon, to form an organic film having a thickness of 60 nm. This was dried by heating on a hot plate at 150° C. for 10 minutes, in a nitrogen gas atmosphere having an oxygen concentration and a moisture concentration both of which were 10 ppm or less (volume base), to form a light emitting layer.

Next, sodium fluoride was vapor-deposited with a thickness of about 4 nm, then, aluminum was vapor-deposited with a thickness of about 80 nm, as a cathode, to fabricate a light emitting device D1. After the degree of vacuum reached $1\times10^{-4}$ Pa or less, vapor deposition of a metal was initiated.

When voltage was applied to the light emitting device D1, EL light emission showing a peak at 505 nm was obtained from this device. LT75 when driven with constant current at an initial luminance of 3000 cd/m$^2$ was 4.6 hours. The result is shown in Table 9.

Example D2: Fabrication and Evaluation of Light Emitting Device D2

A light emitting device D2 was fabricated in the same manner as in Example D1 excepting that a 1.5 wt-% xylene solution was prepared using the polymer compound P-6 instead of the polymer compound P-1 in Example D1.

When voltage was applied to the light emitting device D2, EL light emission showing a peak at 505 nm was obtained from this device. LT75 when driven with constant current at an initial luminance of 3000 cd/m$^2$ was 4.5 hours. The result is shown in Table 9.

Example D3: Fabrication and Evaluation of Light Emitting Device D3

A light emitting device D3 was fabricated in the same manner as in Example D1 excepting that a 0.7 wt % xylene solution was prepared using the polymer compound C-4 instead of the polymer compound P-4 in Example D1.

When voltage was applied to the light emitting device D3, EL light emission showing a peak at 505 nm was obtained from this device. LT75 when driven with constant current at an initial luminance of 3000 cd/m$^2$ was 3.6 hours. The result is shown in Table 9.

Comparative Example CD1: Fabrication and Evaluation of Light Emitting Device CD1

A light emitting device CD1 was fabricated in the same manner as in Example D1 excepting that a 1.5 wt % xylene solution was prepared using the polymer compound C-1 instead of the polymer compound P-1 in Example D1.

When voltage was applied to the light emitting device CD1, EL light emission showing a peak at 505 nm was obtained from this device. LT75 when driven with constant current at an initial luminance of 3000 cd/m² was 1.0 hour. The result is shown in Table 9.

TABLE 9

| Light emitting device | Hole transporting layer | | Light emitting layer | | LT75 (hour) |
|---|---|---|---|---|---|
| | Polymer compound | Hydroxyl groups (mol %) | Polymer compound | Hydroxyl groups (mol %) | |
| Example D1 D1 | P-4 | less than 0.01 | P-1 | less than 0.01 | 4.6 |
| Example D2 D2 | P-4 | less than 0.01 | P-6 | less than 0.01 | 4.5 |
| Example D3 D3 | C-4 | 0.06 | P-1 | less than 0.01 | 3.6 |
| Comparative Example CD1 CD1 | P-4 | less than 0.01 | C-1 | 0.20 | 1.0 |

Next, sodium fluoride was vapor-deposited with a thickness of about 4 nm, then, aluminum was vapor-deposited with a thickness of about 80 nm, as a cathode, to fabricate a light emitting device D4. After the degree of vacuum reached $1\times10^{-4}$ Pa or less, vapor deposition of a metal was initiated.

When voltage was applied to the light emitting device D4, EL light emission showing a peak at 520 nm was obtained from this device. LT75 when driven with constant current at an initial luminance of 6000 cd/m² was 326.2 hours. The result is shown in Table 10.

Comparative Example CD2: Fabrication and Evaluation of Light Emitting Device CD2

A light emitting device CD2 was fabricated in the same manner as in Example D4 excepting that a 2.2 wt % xylene solution was prepared using the polymer compound C-3 instead of the polymer compound P-3 in Example D4.

When voltage was applied to the light emitting device CD2, EL light emission showing a peak at 520 nm was obtained from this device. LT75 when driven with constant current at an initial luminance of 6000 cd/m² was 314.0 hours. The result is shown in Table 10.

TABLE 10

| Light emitting device | Hole transporting layer | | Light emitting layer | | | LT75 (hour) |
|---|---|---|---|---|---|---|
| | Polymer compound | Hydroxyl groups (mol %) | Polymer compound | Metal complex | Hydroxyl groups (mol %) | |
| Example D4 D4 | P-4 | less than 0.01 | P-3 | 1 | less than 0.01 | 326.2 |
| Comparative Example CD2 CD2 | P-4 | less than 0.01 | C-3 | 1 | 0.02 | 314.0 |

Example D4: Fabrication and Evaluation of Light Emitting Device D4

On a glass substrate carrying thereon an ITO film with a thickness of 45 nm formed by a sputtering method, a mixed solution of ethylene glycol monobutyl ether of polythiophenesulfonic acid/water=3/2 (volume ratio) (manufactured by Sigma Aldrich, trade name: Plexcore OC 1200) was spin-coated to form a film with a thickness of 50 nm, which was then dried on a hot plate at 170° C. for 15 minutes to form a hole injection layer.

Next, the polymer compound P-4 was dissolved in xylene to prepare a 0.7 wt % xylene solution. This xylene solution was spin-coated on the above-described glass substrate having the hole injection layer formed thereon, to form an organic film of the polymer compound P-4 with a thickness of 20 nm. This was heated on a hot plate at 190° C. for 60 minutes, in a nitrogen gas atmosphere having an oxygen concentration and a moisture concentration both of which were 10 ppm or less (volume base), to form a hole transporting layer as an insolubilized organic film.

Next, a composition obtained by mixing the polymer compound P-3 and the metal complex 1 at 70 wt %/30 wt % was dissolved in xylene, to prepare a 2.2 wt % xylene solution. This xylene solution was spin-coated on the above-described glass substrate having the hole transporting layer formed thereon, to form an organic film having a thickness of 80 nm. This was dried by heating on a hot plate at 150° C. for 10 minutes, in a nitrogen gas atmosphere having an oxygen concentration and a moisture concentration both of which were 10 ppm or less (volume base), to form a light emitting layer.

Example D5: Fabrication and Evaluation of Light Emitting Device D5

On a glass substrate carrying thereon an ITO film with a thickness of 45 nm formed by a sputtering method, a mixed solution of ethylene glycol monobutyl ether of polythiophenesulfonic acid/water=3/2 (volume ratio) (manufactured by Sigma Aldrich, trade name: Plexcore OC 1200) was spin-coated to form a film with a thickness of 50 nm, which was then dried on a hot plate at 170° C. for 15 minutes to form a hole injection layer.

Next, the polymer compound P-4 was dissolved in xylene to prepare a 0.7 wt % xylene solution. This xylene solution was spin-coated on the above-described glass substrate having the hole injection layer formed thereon, to form an organic film of the polymer compound P-4 with a thickness of 20 nm. This was heated on a hot plate at 190° C. for 60 minutes, in a nitrogen gas atmosphere having an oxygen concentration and a moisture concentration both of which were 10 ppm or less (volume base), to form a hole transporting layer as an insolubilized organic film.

Next, a composition obtained by mixing the polymer compound P-1 and the metal complex 2 at 95 wt %/5 wt % was dissolved in xylene, to prepare a 1.9 wt % xylene solution. This xylene solution was spin-coated on the above-described glass substrate having the hole transporting layer formed thereon, to form an organic film having a thickness of 80 nm. This was dried by heating on a hot plate at 150° C. for 10 minutes, in a nitrogen gas atmosphere having an oxygen concentration and a moisture concentration both of which were 10 ppm or less (volume base), to form a light emitting layer.

Next, sodium fluoride was vapor-deposited with a thickness of about 4 nm, then, aluminum was vapor-deposited with a thickness of about 80 nm, as a cathode, to fabricate a light emitting device D5. After the degree of vacuum reached $1\times10^{-4}$ Pa or less, vapor deposition of a metal was initiated.

When voltage was applied to the light emitting device D5, EL light emission showing a peak at 625 nm was obtained from this device. LT75 when driven with constant current at an initial luminance of 4000 cd/m$^2$ was 442.3 hours. The result is shown in Table 11.

Example D6: Fabrication and Evaluation of Light Emitting Device D6

A light emitting device D6 was fabricated in the same manner as in Example D5 excepting that a 1.9 wt % xylene solution was prepared using the polymer compound P-6 instead of the polymer compound P-1 in Example D5.

When voltage was applied to the light emitting device D6, EL light emission showing a peak at 625 nm was obtained from this device. LT75 when driven with constant current at an initial luminance of 4000 cd/m$^2$ was 423.2 hours. The result is shown in Table 11.

Example D7: Fabrication and Evaluation of Light Emitting Device D7

A light emitting device D7 was fabricated in the same manner as in Example D5 excepting that a 0.7 wt % xylene solution was prepared using the polymer compound C-4 instead of the polymer compound P-4 in Example D5.

When voltage was applied to light emitting device D7, EL light emission showing a peak at 625 nm was obtained from this device. LT75 when driven with constant current at an initial luminance of 4000 cd/m$^2$ was 382.2 hours. The result is shown in Table 11.

Comparative Example CD3: Fabrication and Evaluation of Light Emitting Device CD3

A light emitting device CD3 was fabricated in the same manner as in Example D5 excepting that a 1.9 wt % xylene solution was prepared using the polymer compound C-1 instead of the polymer compound P-1 in Example D5.

When voltage was applied to the light emitting device CD3, EL light emission showing a peak at 625 nm was obtained from this device. LT75 when driven with constant current at an initial luminance of 4000 cd/m$^2$ was 166.2 hours. The result is shown in Table 11.

Comparative Example CD4: Fabrication and Evaluation of Light Emitting Device CD4

A light emitting device CD4 was fabricated in the same manner as in Example D5 excepting that a 1.9 wt % xylene solution was prepared using the polymer compound C-2/polymer compound C-1/metal complex 2=57 wt %/38 wt %/5 wt % instead of the polymer compound P-1/metal complex 2=95 wt %/5 wt % in Example D5.

When voltage was applied to the light emitting device CD4, EL light emission showing a peak at 625 nm was obtained from this device. LT75 when driven with constant current at an initial luminance of 4000 cd/m$^2$ was 257.2 hours.

Based on the content of the hydroxyl groups contained in each of the polymer compounds C-2 and C-1 and the weight ratio of the polymer compounds C-2 and C-1, the average content of the hydroxyl groups of the polymer compounds contained in the light emitting layer was 0.10 mol %. The result is shown in Table 11.

Comparative Example CD5: Fabrication and Evaluation of Light Emitting Device CD5

A light emitting device CD5 was fabricated in the same manner as in Example D5 excepting that a 1.9 wt % xylene solution was prepared using the polymer compound C-2 instead of the polymer compound P-1 in Example D5.

When voltage was applied to the light emitting device CD5, EL light emission showing a peak at 625 nm was obtained from this device. LT75 when driven with constant current at an initial luminance of 4000 cd/m$^2$ was 358.2 hours. The result is shown in Table 11.

TABLE 11

| Light emitting device | Hole transporting layer | | Light emitting layer | | | LT75 (hour) |
| --- | --- | --- | --- | --- | --- | --- |
| | Polymer compound | Hydroxyl groups (mol %) | Polymer compound | Metal complex | Hydroxyl groups (mol %) | |
| Example D5 D5 | P-4 | less than 0.01 | P-1 | 2 | less than 0.01 | 442.3 |
| Example D6 D6 | P-4 | less than 0.01 | P-6 | 2 | less than 0.01 | 423.2 |
| Example D7 D7 | C-4 | 0.06 | P-1 | 2 | less than 0.01 | 382.2 |
| Comparative Example CD3 CD3 | P-4 | less than 0.01 | C-1 | 2 | 0.20 | 166.2 |
| Comparative Example CD4 CD4 | P-4 | less than 0.01 | C-2/C-1 | 2 | 0.10 | 257.2 |
| Comparative Example CD5 CD5 | P-4 | less than 0.01 | C-2 | 2 | 0.03 | 358.2 |

Example D8: Fabrication and Evaluation of Light Emitting Device D8

On a glass substrate carrying thereon an ITO film with a thickness of 45 nm formed by a sputtering method, a mixed solution of ethylene glycol monobutyl ether of polythiophenesulfonic acid/water=3/2 (volume ratio) (manufactured by Sigma Aldrich, trade name: Plexcore OC 1200) was spin-coated to form a film with a thickness of 50 nm, which was then dried on a hot plate at 170° C. for 15 minutes to form a hole injection layer.

Next, the polymer compound P-4 was dissolved in xylene to prepare a 0.7 wt % xylene solution. This xylene solution was spin-coated on the above-described glass substrate having the hole injection layer formed thereon, to form an organic film of the polymer compound P-4 with a thickness of 20 nm. This was heated on a hot plate at 190° C. for 60 minutes, in a nitrogen gas atmosphere having an oxygen concentration and a moisture concentration both of which were 10 ppm or less (volume base), to form a hole transporting layer as an insolubilized organic film.

Next, a composition obtained by mixing the polymer compound P-5 and the metal complex 2 at 95 wt %/5 wt % was dissolved in xylene, to prepare a 1.5 wt % xylene solution. This xylene solution was spin-coated on the above-described glass substrate having the hole transporting layer formed thereon, to form an organic film having a thickness of 80 nm. This was dried by heating on a hot plate at 150° C. for 10 minutes, in a nitrogen gas atmosphere having an oxygen concentration and a moisture concentration both of which were 10 ppm or less (volume base), to form a light emitting layer.

Next, sodium fluoride was vapor-deposited with a thickness of about 4 nm, then, aluminum was vapor-deposited with a thickness of about 80 nm, as a cathode, to fabricate a light emitting device D8. After the degree of vacuum reached $1\times10^{-4}$ Pa or less, vapor deposition of a metal was initiated.

When voltage was applied to the resultant light emitting device D8, EL light emission showing a peak at 625 nm was obtained from this device. The time until the luminance became 90% of the initial luminance (LT90) when driven with constant current at an initial luminance of 6000 cd/m² was 21.9 hours.

INDUSTRIAL APPLICABILITY

The present invention is a polymer compound which is useful for production of a light emitting device excellent in luminance life.

The invention claimed is:
1. A method for producing a polymer compound comprising a constitutional unit represented by the following formula (1) and a constitutional unit represented by the following formula (X) and/or a constitutional unit represented by the following formula (Y), wherein the constitutional unit represented by the formula (1) is a constitutional unit represented by the following formula (1-1) or (1-2), the constitutional unit represented by the formula (X) is a constitutional unit represented by the following formula (X-1), (X-2), (X-3), (X-4), (X-5), (X-6), or (X-7), and the constitutional unit represented by the formula (Y) is a constitutional unit represented by the following formula (Y-3), (Y-4), (Y-5), (Y-6), or (Y-7),
wherein the content of the hydroxyl groups contained in the polymer compound is less than 0.02 mol % and the content of the phosphorus atoms contained in the polymer compound is less than 50 ppm:

  (1)

wherein $Ar^1$ represents an arylene group and this group optionally has a substituent,

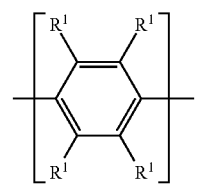  (1-1)

wherein $R^1$ represents a hydrogen atom, an alkyl group, an alkoxy group, an aryl group or a monovalent heterocyclic group and these groups each optionally have a substituent, and the $R^1$s may be the same or different and adjacent $R^1$s may be combined together to form a ring together with the carbon atoms to which they are attached,

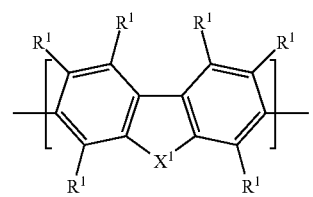  (1-2)

wherein
$R^1$ represents the same meaning as described above, and
$X^1$ represents a group represented by $-C(R^2)_2-$, $-C(R^2)=C(R^2)-$ or $C(R^2)_2-C(R^2)_2-$, and $R^2$ represents a hydrogen atom, an alkyl group, an alkoxy group, an aryl group or a monovalent heterocyclic group and these groups each optionally have a substituent, and the $R^2$s may be the same or different and the $R^2$s may be combined together to form a ring together with the carbon atoms to which they are attached,

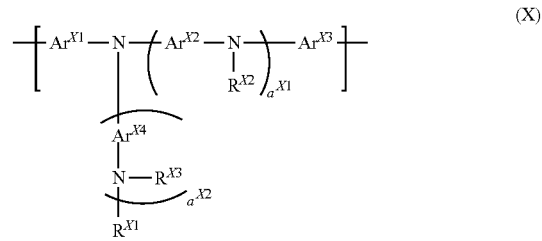  (X)

wherein
$a^{X1}$ and $a^{X2}$ each independently represent an integer of 0 or more,
$Ar^{X1}$ and $Ar^{X3}$ each independently represent an arylene group or a divalent heterocyclic group and these groups each optionally have a substituent,
$Ar^{X2}$ and $Ar^{X4}$ each independently represent an arylene group, a divalent heterocyclic group or a divalent group in which at least one arylene group and at least one divalent heterocyclic group are bonded directly to each other, and these groups each optionally have a substituent, and when there are a plurality of Ar$^{X2}$ and a plurality of Ar$^{X4}$, each of them may be the same or different, and R$^{X1}$, R$^{X2}$ and R$^{X3}$ each independently represent an alkyl group, an aryl group or a monovalent heterocyclic group and these groups each optionally have a substituent, and when there are a plurality of R$^{X2}$ and a plurality of R$^{X3}$, each of them may be the same or different,

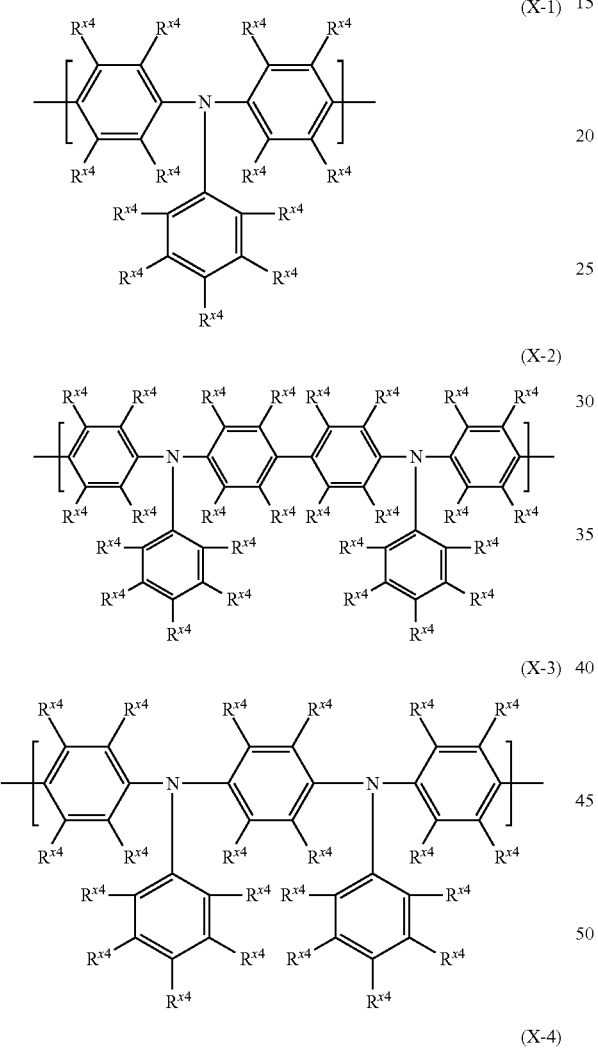

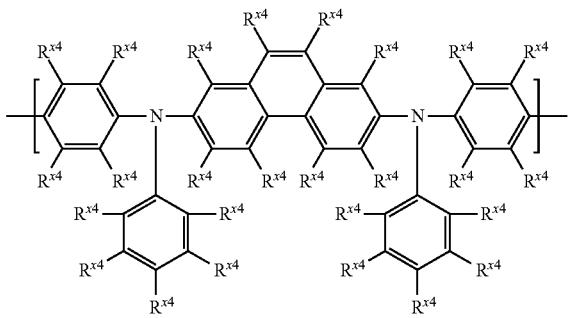

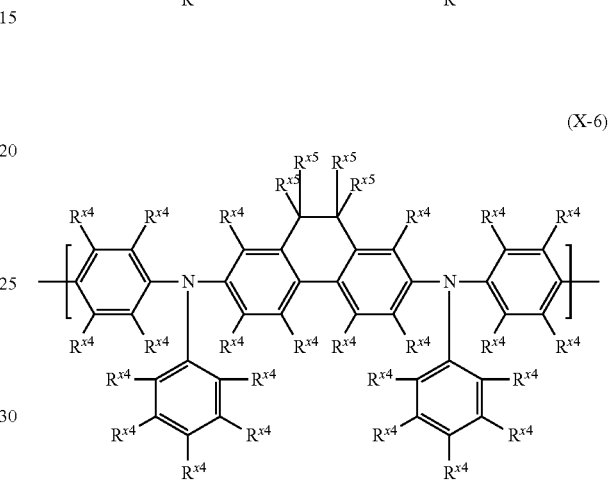

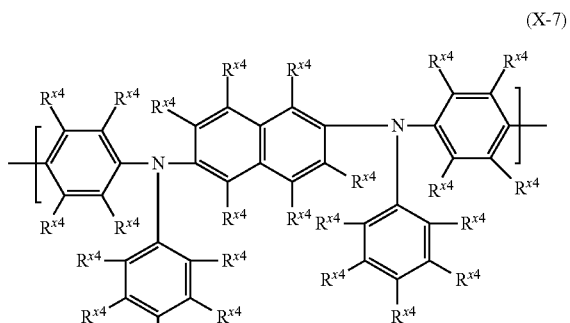

wherein R$^{X4}$ and R$^{X5}$ each independently represent a hydrogen atom, an alkyl group, an alkoxy group, an aryl group, an aryloxy group, a fluorine atom, a monovalent heterocyclic group or a cyano group and these groups each optionally have a substituent, and the R$^{X4}$s may be the same or different, and the R$^{X5}$s may be the same or different and adjacent R$^{X5}$s may be combined together to form a ring together with the carbon atoms to which they are attached, $$-\!\!\!\!-\!\!\text{Ar}^{Y1}\!\!-\!\!\!\!-\qquad\qquad\text{(Y)}$$

wherein Ar$^{Y1}$ represents an arylene group, a divalent heterocyclic group or a divalent group in which at least one arylene group and at least one divalent heterocyclic group are bonded directly to each other, and these groups each optionally have a substituent,

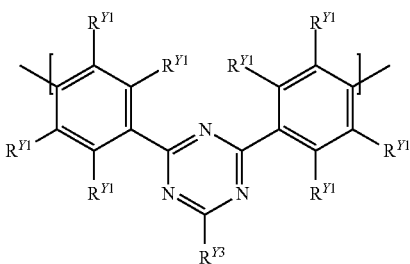
(Y-3)

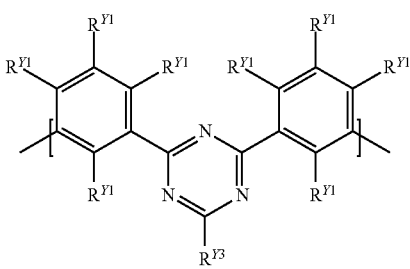
(Y-4)

wherein
R<sup>Y1</sup> represents a hydrogen atom, an alkyl group, an alkoxy group, an aryl group or a monovalent heterocyclic group and these groups each optionally have a substituent, and the R<sup>Y1</sup>s may be the same or different and adjacent R<sup>Y1</sup>s may be combined together to form a ring together with the carbon atoms to which they are attached, and R<sup>Y3</sup> represents a hydrogen atom, an alkyl group, an alkoxy group, an aryl group or a monovalent heterocyclic group and these groups each optionally have a substituent,

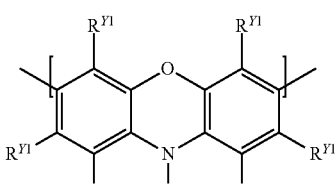
(Y-5)

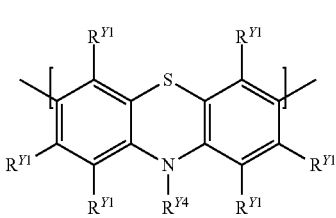
(Y-6)

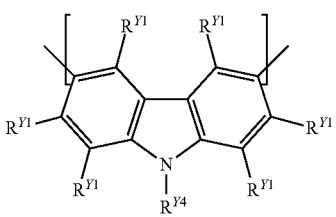
(Y-7)

wherein
R<sup>Y1</sup> represents the same meaning as described above, and
R<sup>Y4</sup> represents an alkyl group, an alkoxy group, an aryl group or a monovalent heterocyclic group and these groups each optionally have a substituent, the method comprising a step of Suzuki polymerizing a compound represented by the following formula (M-1) and a compound represented by the following formula (M-X) and/or a compound represented by the following formula (M-Y), wherein the compound represented by the formula (M-Y) differs from the compound represented by the formula (M-1) in the presence of a dichlorobis(dicyclopentyl(o-methoxyphenyl)phosphinepalladium catalyst, a base, and a solvent, under a condition of an oxygen concentration of less than 0.2%:

(M-1)

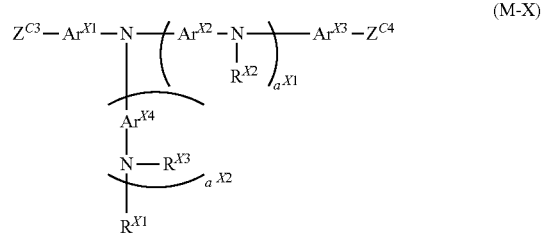
(M-X)

(M-Y)

wherein
Ar<sup>1</sup>, a<sup>X1</sup>, a<sup>X2</sup>, Ar<sup>X1</sup>, Ar<sup>X3</sup>, Ar<sup>X2</sup>, Ar<sup>X4</sup>, R<sup>X1</sup>, R<sup>X2</sup>, R<sup>X3</sup> and Ar<sup>Y1</sup> represent the same meanings as described above, and Z<sup>C1</sup> and Z<sup>C2</sup> each independently represent a group selected from Group B substituents, and Z<sup>C3</sup>, Z<sup>C4</sup>, Z<sup>C5</sup> and Z<sup>C6</sup> each independently represent a group selected from Group A substituents, Group A substituents comprise:
a chlorine atom, a bromine atom, and an iodine atom Group B substituents comprise:
a group represented by —B(OR<sup>C2</sup>)<sub>2</sub>, wherein R<sup>C2</sup> represents a hydrogen atom, an alkyl group or an aryl group and these groups each optionally have a substituent, and the R<sup>C2</sup>s may be the same or different and may be combined together to form a ring together with the oxygen atoms to which they are attached.

2. The method according to claim 1, wherein the solvent is a mixed solvent comprising an organic solvent and water.

3. The method according to claim 2, wherein the organic solvent is toluene, xylene or mesitylene.

4. The method according to claim 3, wherein the organic solvent is toluene.

5. The method according to claim 1, wherein the polymer compound comprises a constitutional unit represented by the formula (1) and a constitutional unit represented by the following formula (Y-3), (Y-4), (Y-5), (Y-6) or (Y-7):
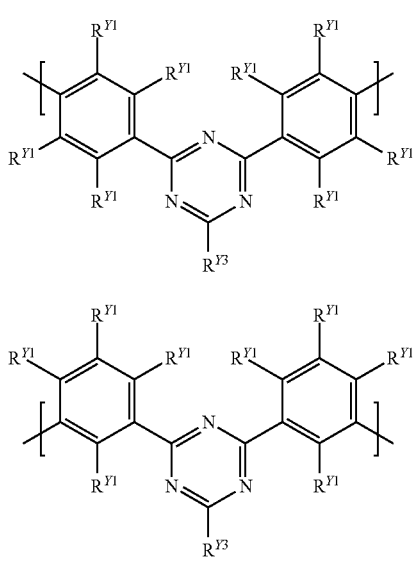
(Y-3)
(Y-4)
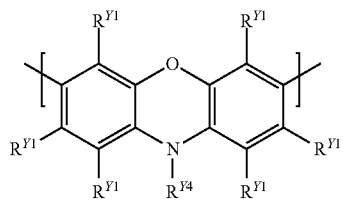
(Y-5)
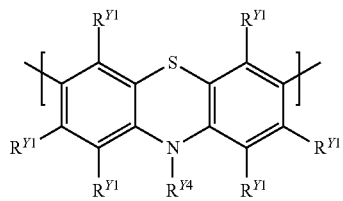
(Y-6)
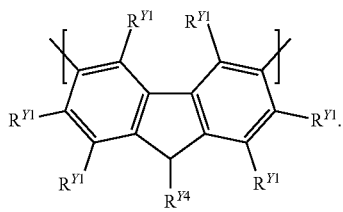
(Y-7)
* * * * *